US009784984B2

(12) United States Patent
Baba

(10) Patent No.: US 9,784,984 B2
(45) Date of Patent: Oct. 10, 2017

(54) IMAGING APPARATUS AND IMAGING METHOD

(75) Inventor: Tomohiko Baba, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 895 days.

(21) Appl. No.: 13/611,019

(22) Filed: Sep. 12, 2012

(65) Prior Publication Data

US 2013/0083172 A1    Apr. 4, 2013

(30) Foreign Application Priority Data

Sep. 30, 2011   (JP) ................. 2011-215895

(51) Int. Cl.
| | | |
|---|---|---|
| H04N 13/00 | (2006.01) | |
| H04N 13/02 | (2006.01) | |
| H04N 5/335 | (2011.01) | |
| G02B 27/26 | (2006.01) | |
| G02B 27/22 | (2006.01) | |
| G02F 1/1335 | (2006.01) | |
| H01L 31/0232 | (2014.01) | |
| H04N 9/04 | (2006.01) | |
| H04N 5/225 | (2006.01) | |

(Continued)

(52) U.S. Cl.
CPC .......... *G02B 27/26* (2013.01); *G02B 27/281* (2013.01); *G03B 35/10* (2013.01); *H04N 5/2254* (2013.01); *H04N 9/045* (2013.01); *H04N 13/0217* (2013.01); *H04N 13/0257* (2013.01); *H04N 13/0289* (2013.01); *H04N 13/0434* (2013.01); *H04N 2209/046* (2013.01); *H04N 2213/001* (2013.01)

(58) Field of Classification Search
USPC ............... 348/49, 42, 46, 50; 396/322, 324, 396/332–334; 359/363, 486.01, 486.02, 359/489.17, 462–465
See application file for complete search history.

(56) References Cited

U.S. PATENT DOCUMENTS

| 8,687,050 B2 * | 4/2014 | Baker ............... H04N 13/0425 348/51 |
| 2002/0118452 A1 * | 8/2002 | Taniguchi .......... G02B 27/2214 359/463 |

(Continued)

FOREIGN PATENT DOCUMENTS

| JP | 6-54991 | 7/1994 |
| JP | 2004-309868 | 11/2004 |

(Continued)

OTHER PUBLICATIONS

Japanese Office Examination Report issued in connection with related Japanese Patent Application No. JP 2011-215895 dated May 26, 2015 with English translation.

*Primary Examiner* — Jorge L Ortiz Criado
*Assistant Examiner* — Susan E Hodges
(74) *Attorney, Agent, or Firm* — Dentons US LLP

(57) ABSTRACT

There is provided an imaging apparatus including a first polarizing unit that polarizes light from an object, a lens system that condenses light from the first polarizing unit, and an imaging element array that has imaging elements arranged in a matrix of a first direction and a second direction orthogonal to the first direction, has a second polarizing unit arranged on a light incident side, and converts the light condensed by the lens system into an electric signal.

27 Claims, 19 Drawing Sheets

(51) Int. Cl.
   *G02B 27/28*    (2006.01)
   *G03B 35/10*    (2006.01)
   *H04N 13/04*    (2006.01)

(56) References Cited

U.S. PATENT DOCUMENTS

| | | | |
|---|---|---|---|
| 2003/0020708 A1* | 1/2003 | Redert | 345/418 |
| 2004/0201888 A1* | 10/2004 | Hagita | 359/462 |
| 2009/0189976 A1* | 7/2009 | Morozov | 348/53 |
| 2012/0133743 A1* | 5/2012 | Hiramoto | H04N 13/0214 348/46 |
| 2012/0188347 A1* | 7/2012 | Mitchell | A61B 1/00193 348/50 |
| 2012/0206576 A1* | 8/2012 | Sato et al. | 348/46 |
| 2012/0300037 A1* | 11/2012 | Laudo | H04N 13/0225 348/46 |

FOREIGN PATENT DOCUMENTS

| | | |
|---|---|---|
| JP | 2010-056865 | 3/2010 |
| JP | 2011-035853 | 2/2011 |
| JP | 2011-145343 | 7/2011 |
| WO | WO/2011/003208 A1 | 1/2011 |
| WO | WO/2011/083542 A1 | 7/2011 |
| WO | WO/2011/097163 A1 | 8/2011 |

\* cited by examiner

FIG.1
[FIRST EMBODIMENT]
(A)
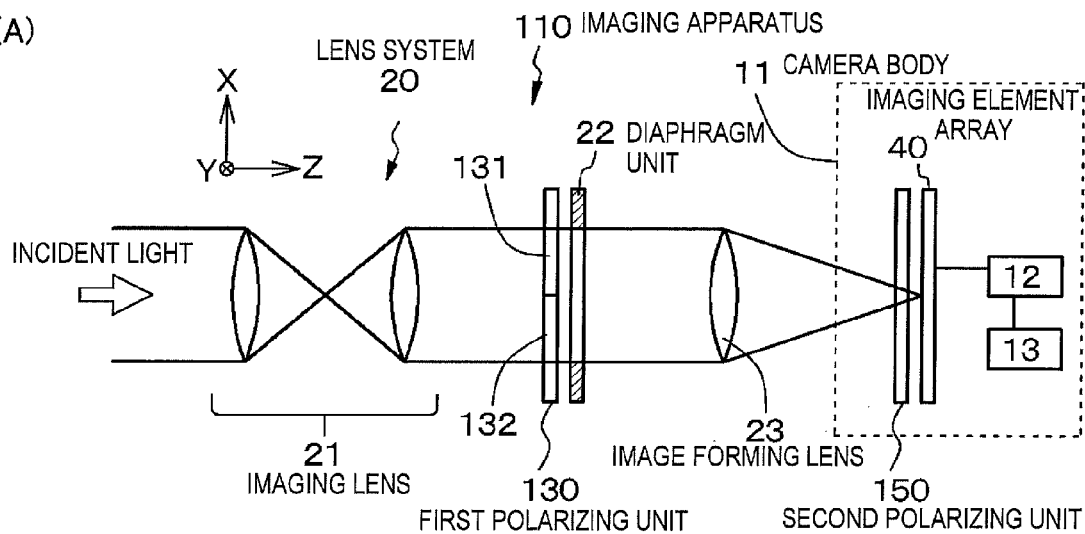
(B)
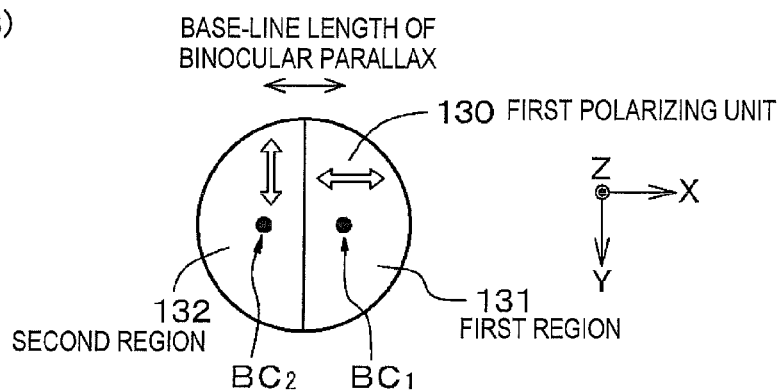
(C)
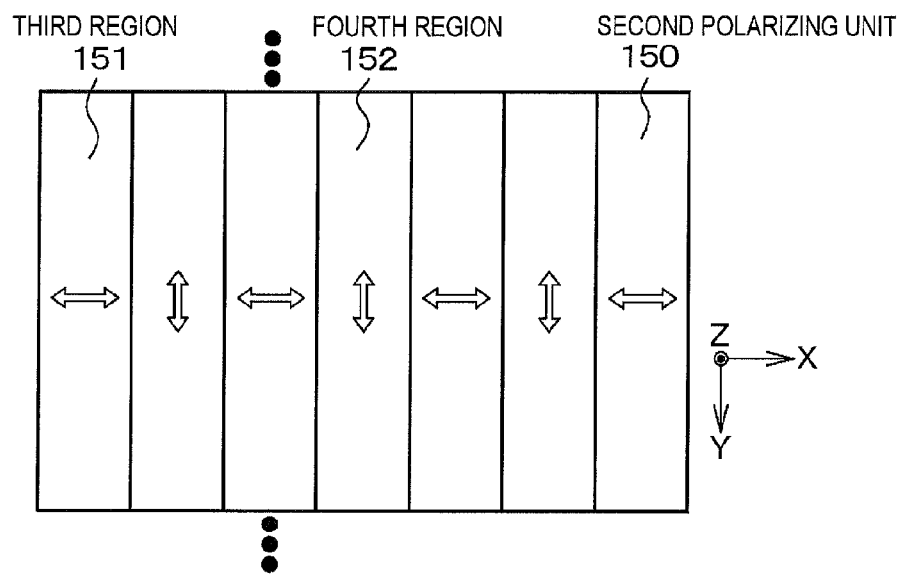

FIG.2
(A)
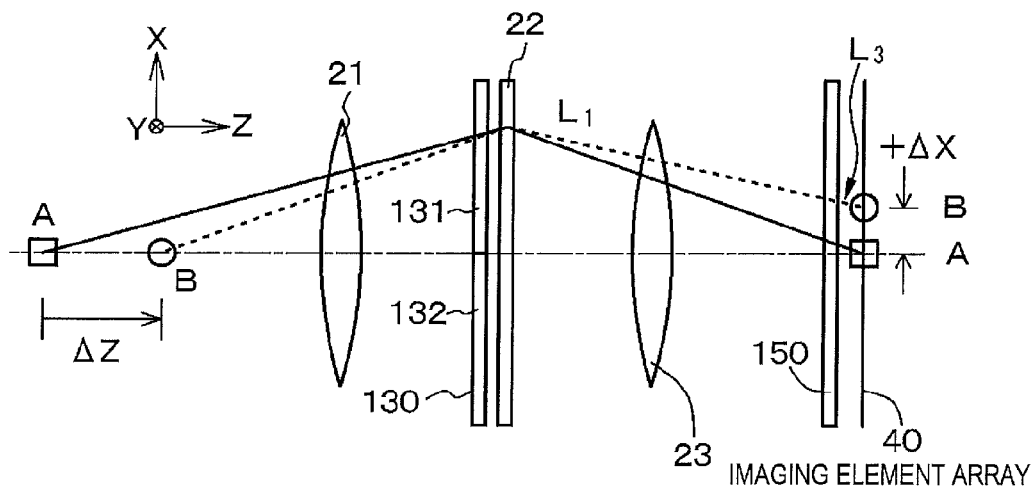
(B)
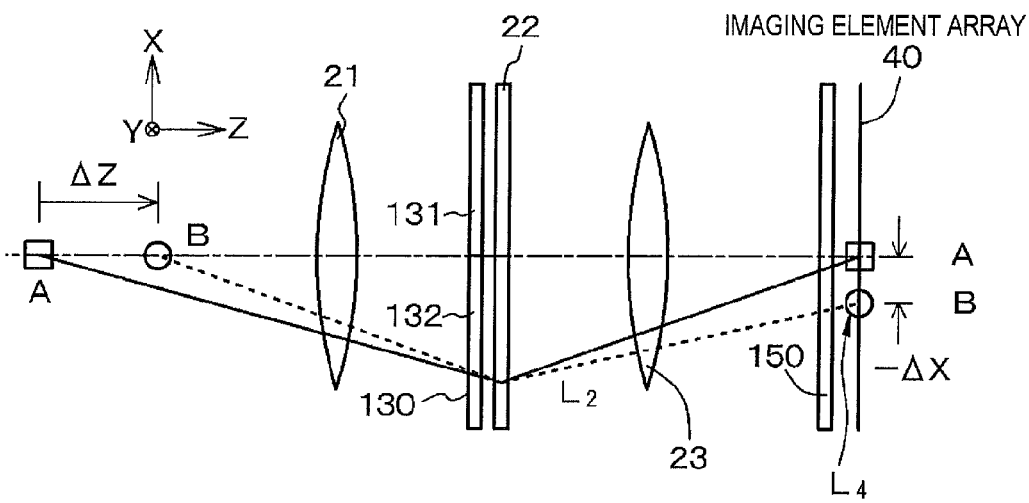
(C)
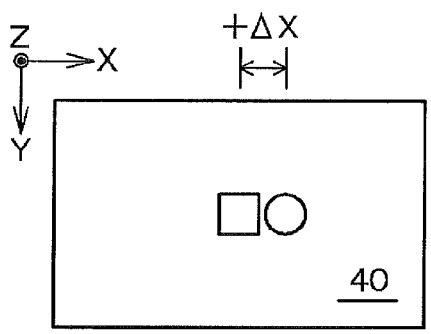
(D)
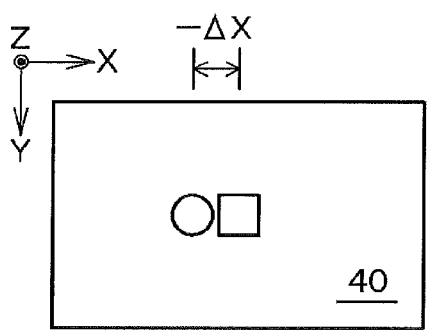

FIG.3
(A)
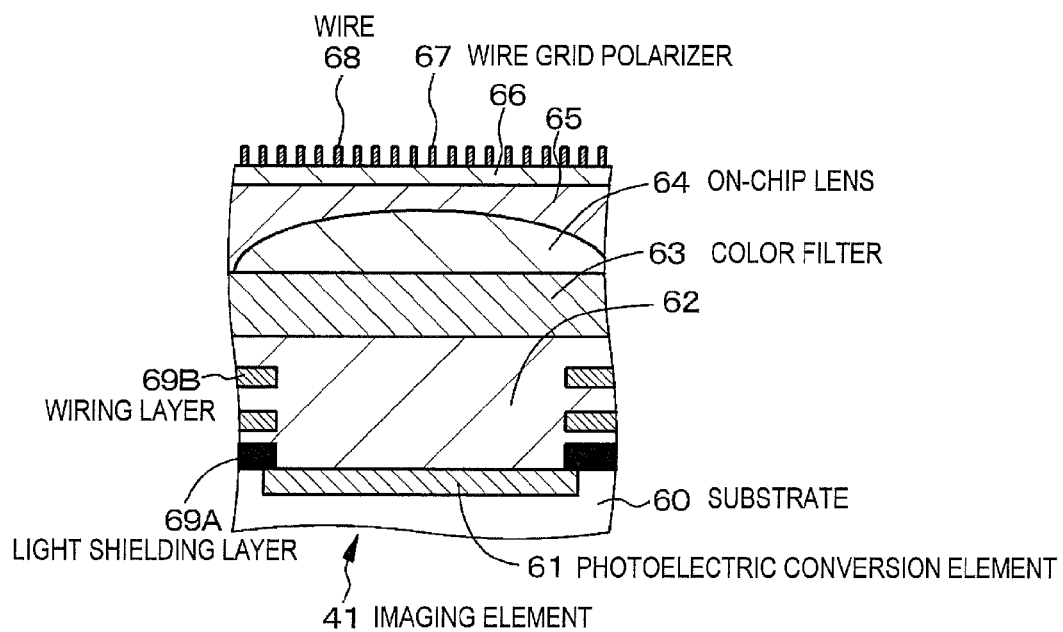
(B)
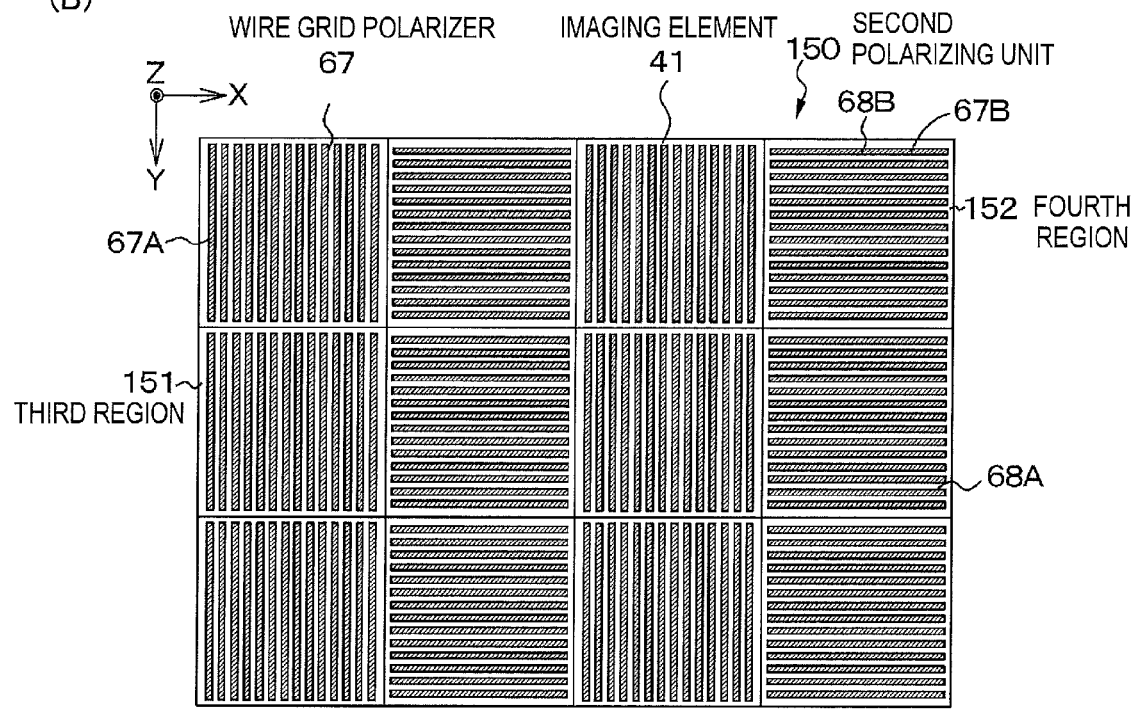

FIG.6
[SECOND EMBODIMENT]
(A)
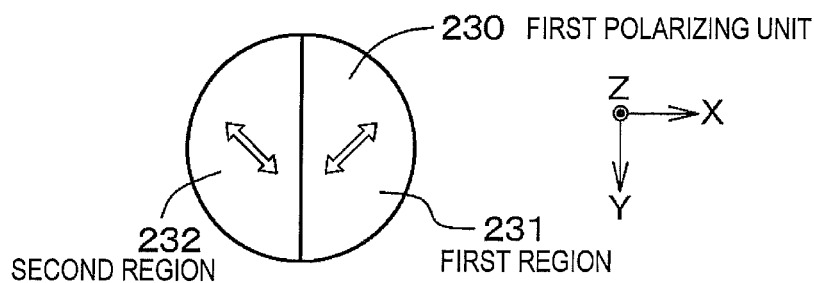
(B)
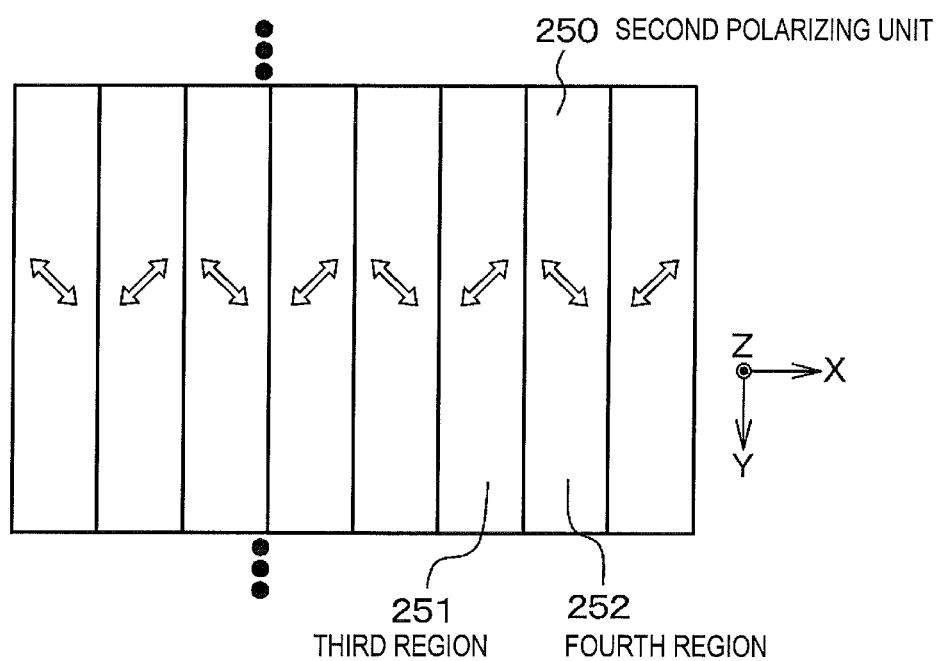

FIG.8
[THIRD EMBODIMENT]
(A)
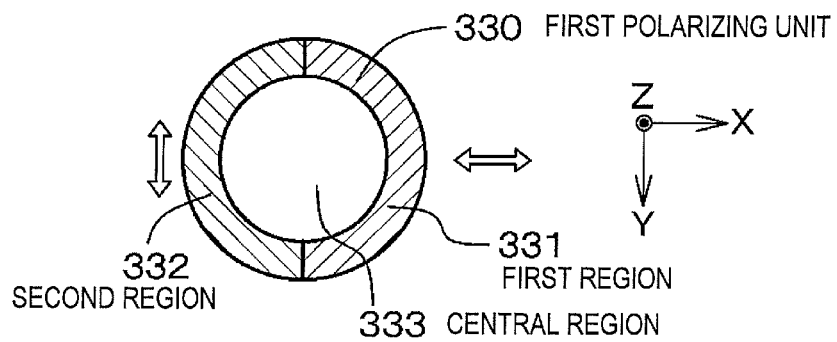
(B)
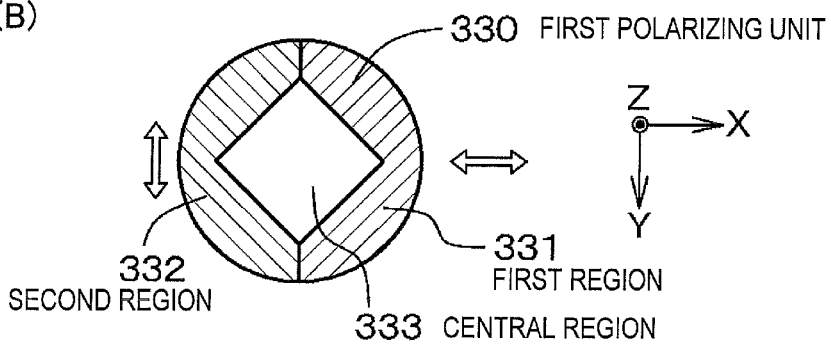
(C)
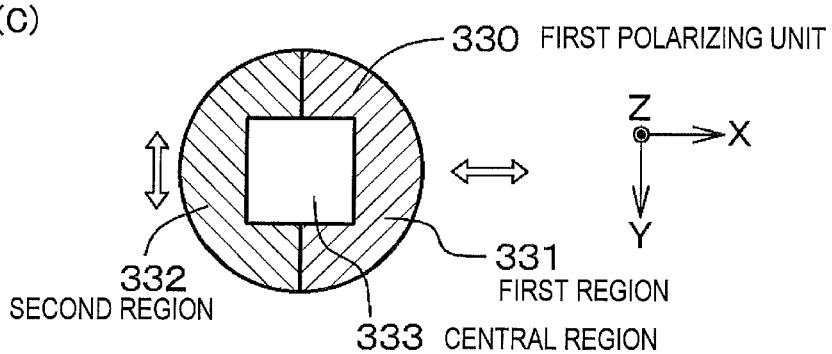
(D)
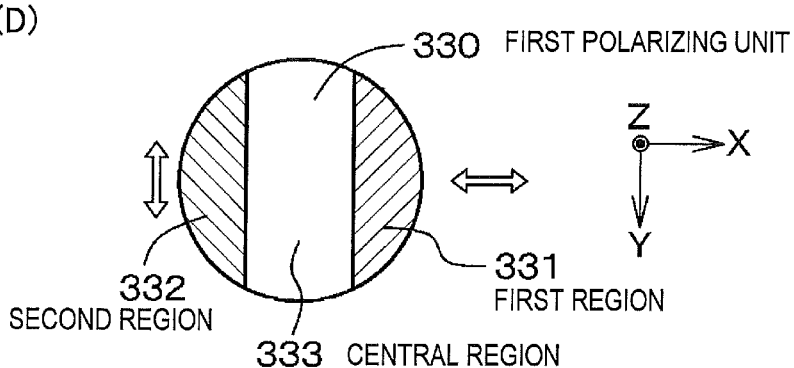

FIG.10
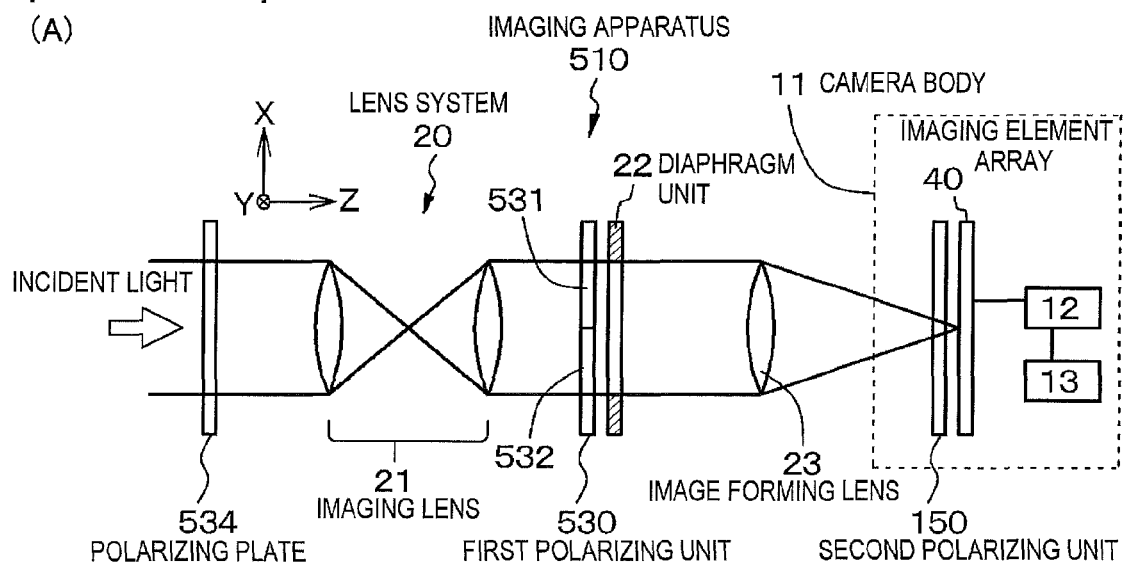
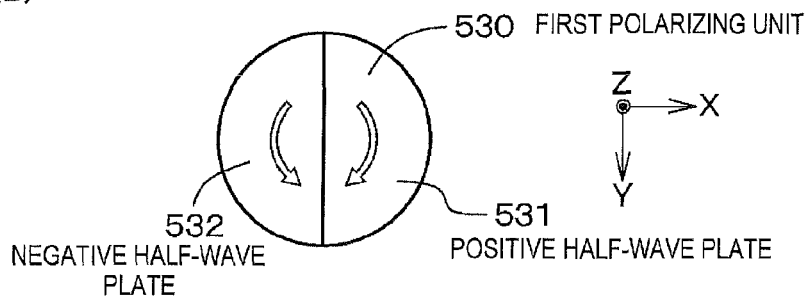
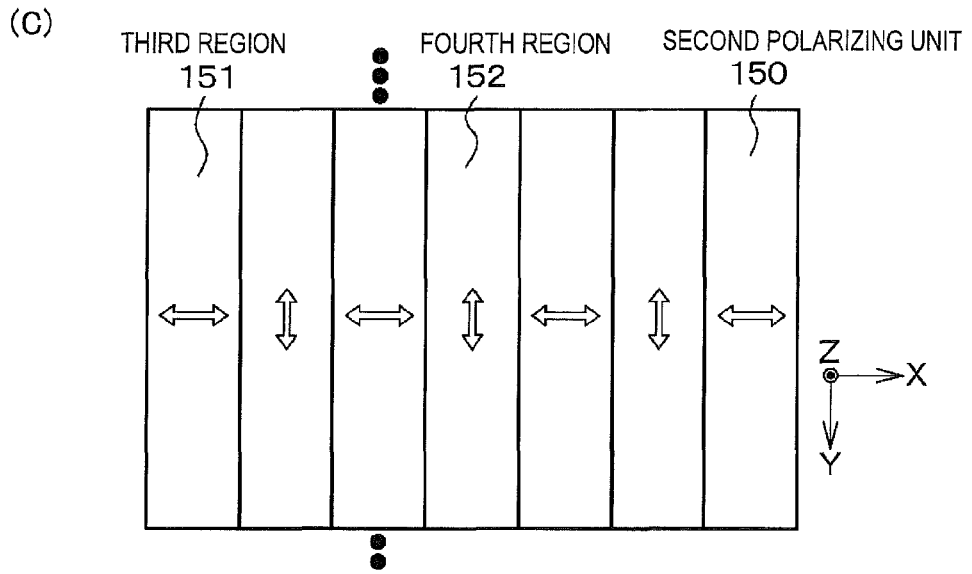

FIG.11
[SEVENTH EMBODIMENT]
(A)
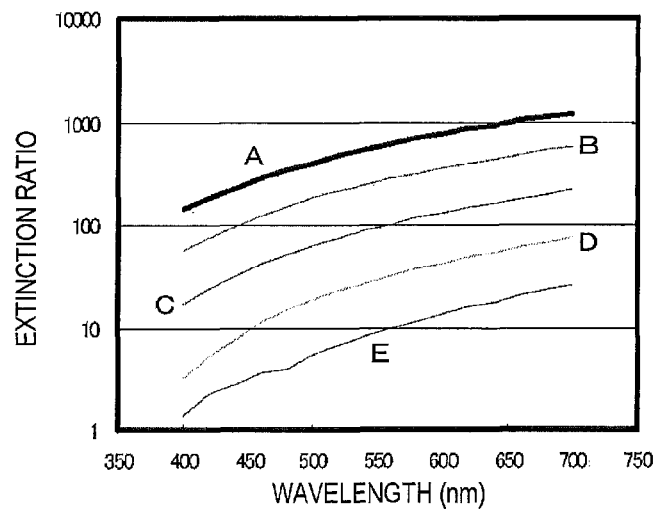
(B)
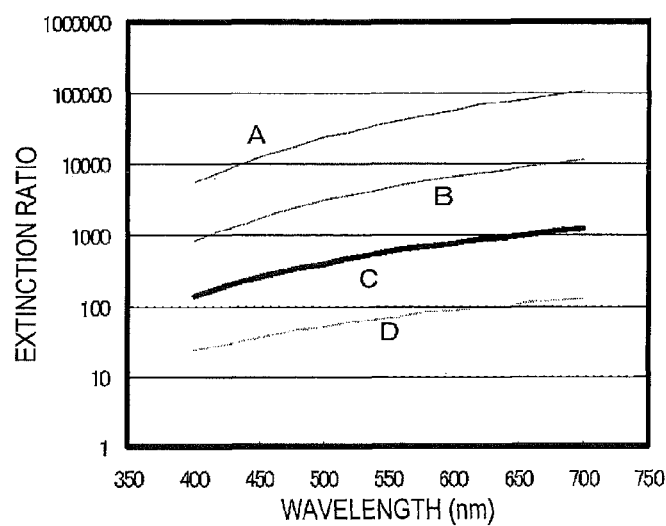
(C)
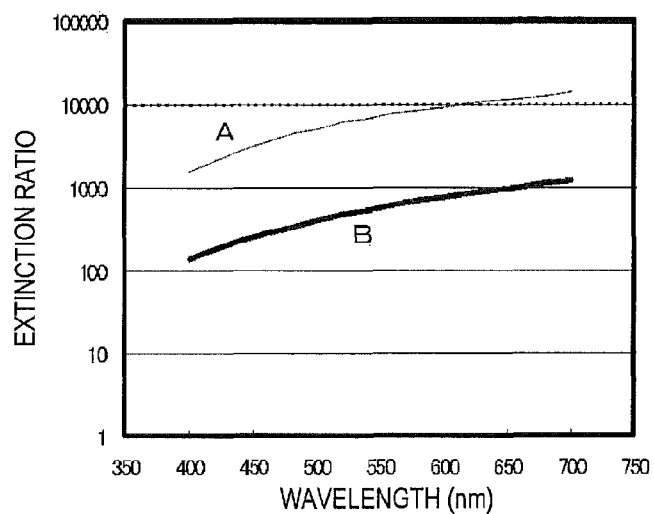

(EIGHTH EMBODIMENT)

(EIGHTH EMBODIMENT)

FIG.15
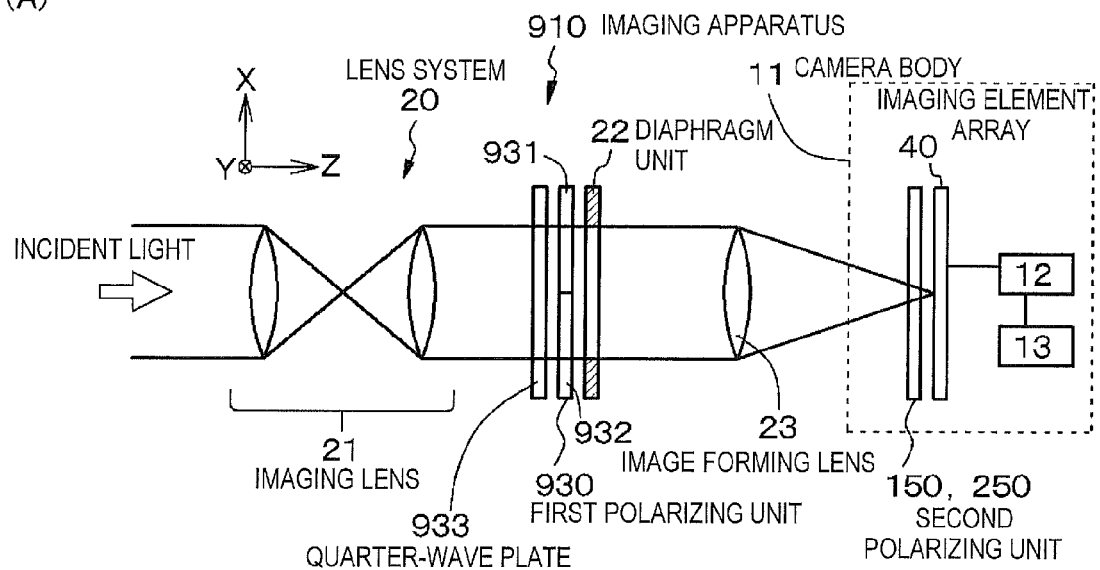
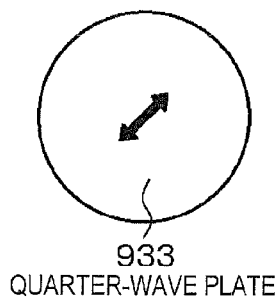
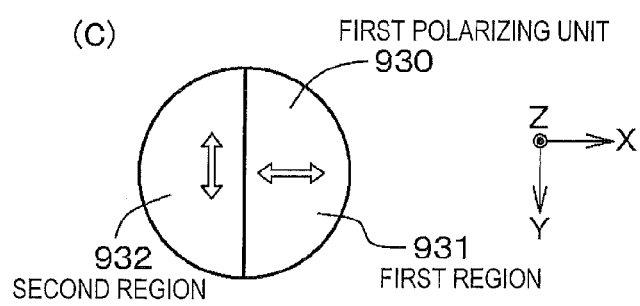
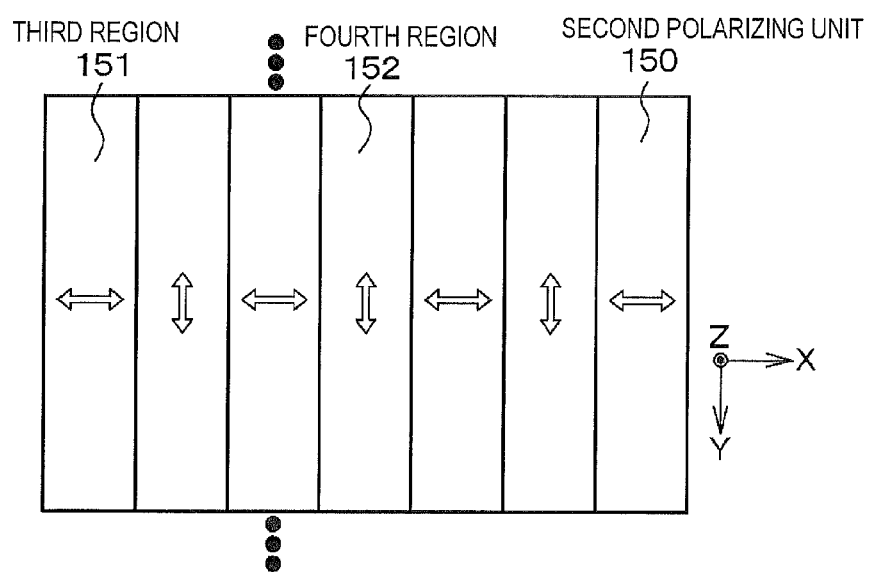

FIG.17
[ELEVENTH EMBODIMENT]
(A)
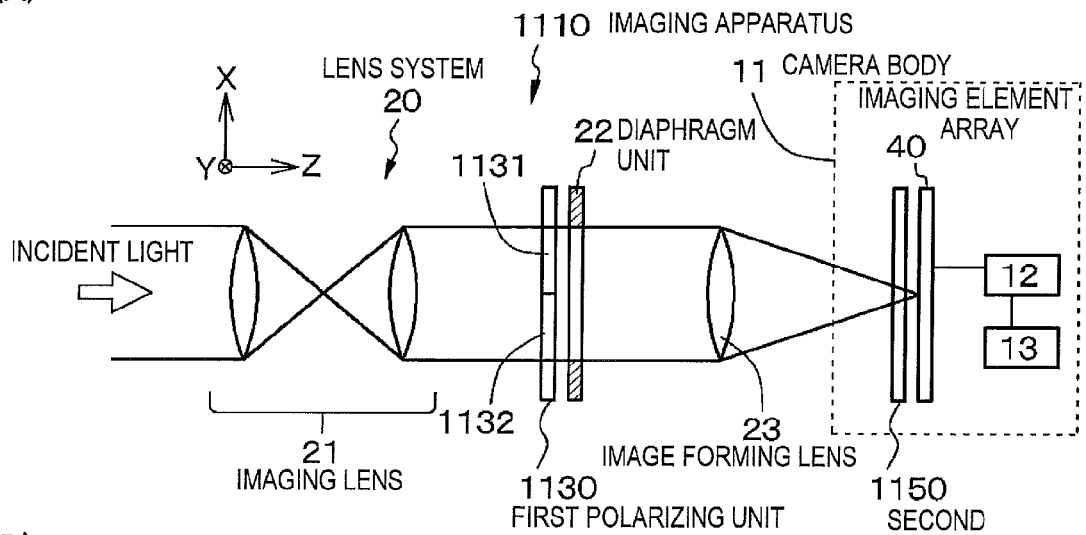
(B)
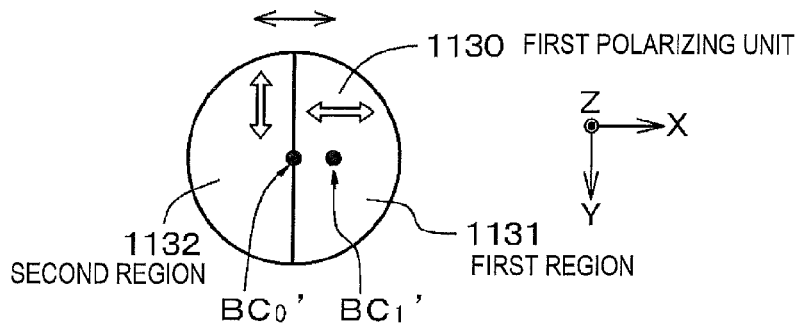
(C)
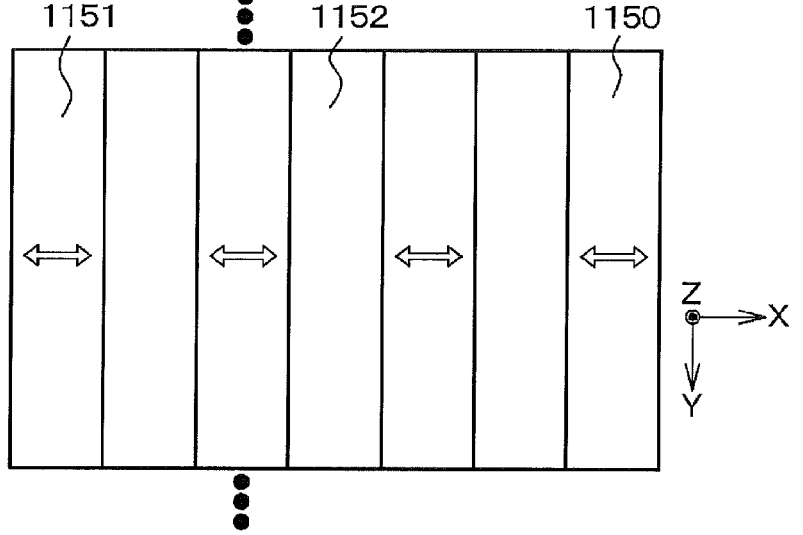

FIG.18
(A)
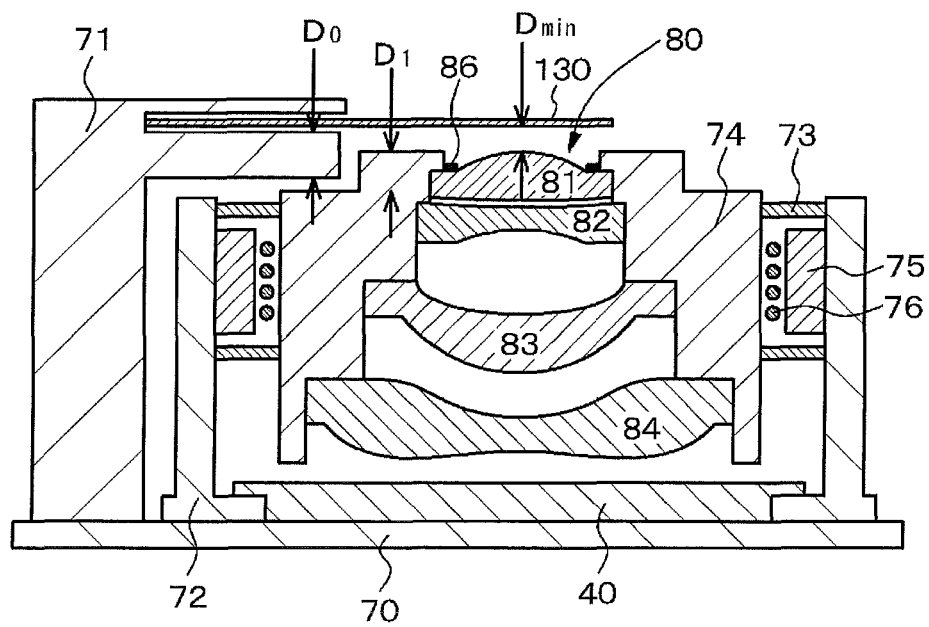
(B)
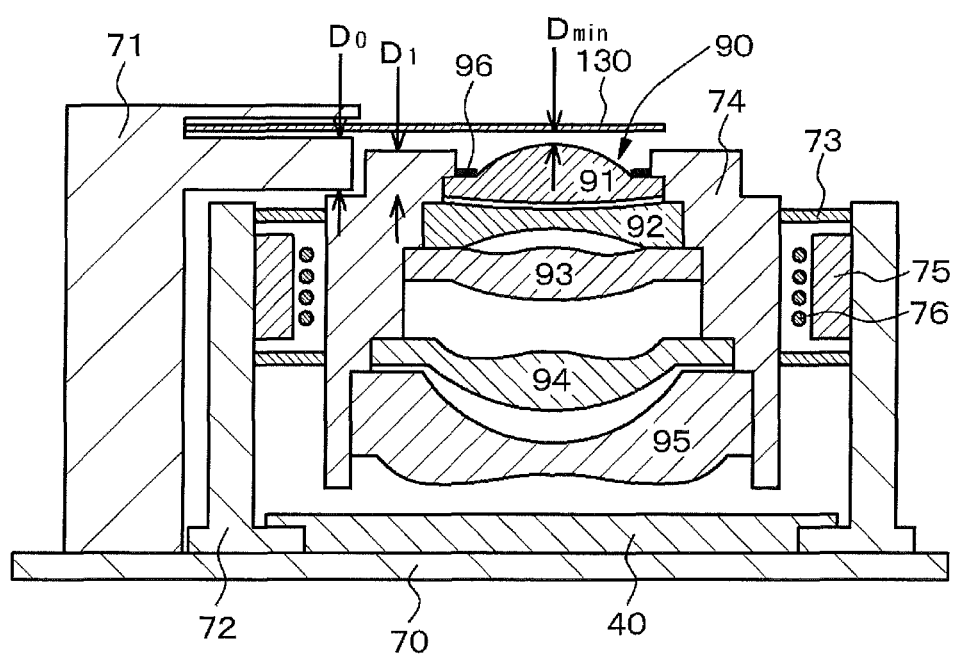

FIG.19
(A)
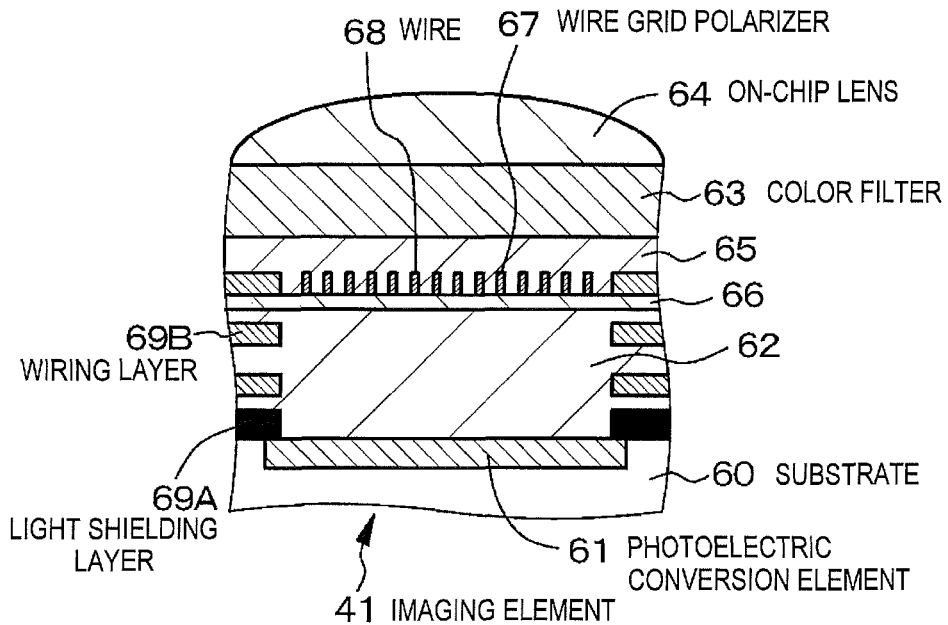
(B)
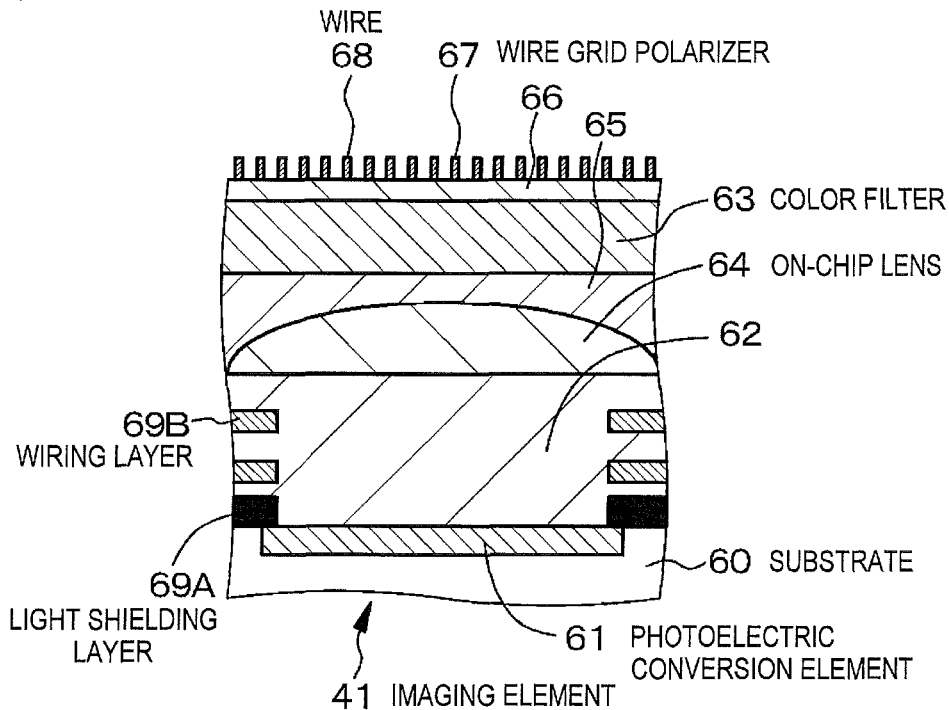

IMAGING APPARATUS AND IMAGING METHOD

BACKGROUND

The present disclosure relates to an imaging apparatus and an imaging method and more particularly, to an image apparatus and an imaging method to image an object as a stereoscopic image.

In the related art, a system for simultaneously imaging a common object using two video cameras arranged on left and right sides, simultaneously outputting two kinds of obtained images (a right eye image and a left eye image), and displaying a stereoscopic image has been suggested. However, when the two video cameras are used, a size of an apparatus may increase and it is not practical to use the two video cameras. A base-line length between the two video cameras, that is, an interocular distance of a stereoscopic camera is generally about 65 mm that corresponds to a human interocular distance, regardless of a zoom ratio of a lens. In this case, binocular parallax in a zoomed-up image may increase and this forces information processing different from normal information processing to be executed in a visual system of an observer and causes visual fatigue. When a moving object is imaged using the two video cameras, precise synchronization control of the two video cameras should be performed. However, the synchronization control is very difficult and accurate control of a convergence angle is also very difficult.

A stereoscopic imaging apparatus in which polarization filters polarized to become orthogonal in relation are combined to facilitate adjustment of a lens system to perform stereoscopic imaging and an optical system is shared has been suggested (for example, refer to Japanese Patent Application Publication (JP-B) No. 6-054991.

A method of performing stereoscopic imaging by an imaging apparatus including two lenses and one imaging unit has been suggested (for example, refer to Japanese Patent Application Laid-Open (JP-A) No. 2004-309868). The imaging apparatus that is disclosed in Japanese Patent Application Laid-Open (JP-A) No. 2004-309868 includes an imaging unit that has pixels, which correspond to integer times of a predetermined number of scanning lines, provided on an imaging surface, a first horizontal component polarizing unit that transmits only a horizontal component in first picture light from an object, and a first vertical component polarizing unit that is arranged at a position apart from the first horizontal component polarizing unit by a predetermined distance and transmits only a vertical component in second picture light from the object. In this case, the horizontal component transmitted by the first horizontal component polarizing unit is converged to the pixels in a predetermined range on the imaging surface and the vertical component transmitted by the first vertical component polarizing unit is converged to the pixels in the remaining range other than the predetermined range. Specifically, a horizontal component polarization filter and a vertical component polarization filter that are arranged to be apart from each other by an interval according to human parallax and two lenses are provided at positions apart from an imaging surface of a CCD by a predetermined distance.

SUMMARY

Meanwhile, according to technology that is disclosed in Japanese Patent Application Publication (JP-B) No. 6-054991, the lens system is shared by overlapping outputs of the two polarization filters and forming a single optical path. However, a polarization filter should be further provided to extract the left eye image and the right eye image in the following step, the optical path should be divided again, and light should be incident on each polarization filter. For this reason, light loss is generated in the lens system and it is difficult to decrease a size of the apparatus. According to technology that is disclosed in Japanese Patent Application Laid-Open (JP-A) No. 2004-309868, because two sets of combinations of lenses and polarization filters should be provided, the apparatus becomes complex and a size of the apparatus increases. That is, it is unrealistic to image not only a stereoscopic image but also a normal two-dimensional image using the imaging apparatus, because the apparatus becomes complicated.

It is desirable to provide an imaging apparatus that has a simple configuration and can image an object as a stereoscopic image and an imaging method using the imaging apparatus.

According to a first embodiment of the present disclosure, there is provided an imaging apparatus, including a first polarizing unit that polarizes light from an object, a lens system that condenses light from the first polarizing unit, and an imaging element array that has imaging elements arranged in a matrix of a first direction and a second direction orthogonal to the first direction, has a second polarizing unit arranged on a light incident side, and converts the light condensed by the lens system into an electric signal. The first polarizing unit has a first region and a second region that are arranged along the first direction, a polarization state of first region passing light that has passed through the first region is different from a polarization state of second region passing light that has passed through the second region, the second polarizing unit has a plurality of third regions and a plurality of fourth regions that are arranged alternately along the first direction and extend in the second direction, a polarization state of third region passing light that has passed through the third region is different from a polarization state of fourth region passing light that has passed through the fourth region, and the first region passing light passes through the third region and arrives at the imaging element and the second region passing light passes through the fourth region and arrives at the imaging element, thereby imaging an image to obtain a stereoscopic image in which a distance between a center of gravity point of the first region and a center of gravity point of the second region is set as a base-line length of binocular parallax.

According to the first embodiment of the present disclosure, there is provided an imaging method using the imaging apparatus according to the embodiment of the present disclosure, which includes generating an electric signal to obtain a right eye image in the imaging element, by the first region passing light that passes through the third region and arrives at the imaging element, generating an electric signal to obtain a left eye image in the imaging element, by the second region passing light that passes through the fourth region and arrives at the imaging element, and outputting the generated electric signals.

According to a second embodiment of the present disclosure, there is provided an imaging apparatus, including a first polarizing unit that polarizes light from an object, a lens system that condenses light from the first polarizing unit, and an imaging element array that has imaging elements arranged in a matrix of a first direction and a second direction orthogonal to the first direction, has a second polarizing unit arranged on a light incident side, and converts the light condensed by the lens system into an electric signal. The first polarizing unit has a first region and a second region that are arranged along the first direction, a polarization state of first region passing light that has passed through the first region is different from a polarization state of second region passing light that has passed through the second region, the second polarizing unit has a plurality of third regions and a plurality of fourth regions that are arranged alternately along the first direction and extend in the second direction, third region passing light that has passed through the third region is in a polarization state and fourth region passing light that has passed through the fourth region is in a non-polarization state, and the first region passing light passes through the third region and arrives at the imaging element and the first region passing light and the second region passing light pass through the fourth region and arrive at the imaging element, thereby imaging an image to obtain a stereoscopic image in which a distance between a center of gravity point of the first region and a center of gravity point of the first polarizing unit is set as a base-line length of binocular parallax.

According to the second embodiment of the present disclosure, there is provided an imaging method using the imaging apparatus according to another embodiment of the present disclosure, which includes generating an electric signal to obtain one of a right eye image and a left eye image in the imaging element, by the first region passing light that passes through the third region and arrives at the imaging element, generating an electric signal to obtain the other of the right eye image and the left eye image in the imaging element, by the first region passing light and the second region passing light that passes through the fourth region and arrives at the imaging element, and outputting the generated electric signals.

According to the embodiments of the present disclosure described above, because the imaging apparatus is configured using one set of the first polarizing unit and the second polarizing unit and one lens system, a small imaging apparatus that has a monocular simple configuration can be provided. Because two sets of combinations of lenses and polarization filters are not necessary, a deviation or a difference does not occur in zooming, a diaphragm unit, focusing, and a convergence angle. Because the base-line length of the binocular parallax is relatively short, a natural stereoscopic effect can be obtained. A two-dimensional image and a three-dimensional image can be easily obtained by mounting or removing the first polarizing unit.

BRIEF DESCRIPTION OF THE DRAWINGS

FIGS. 1A to 1C are a conceptual diagram of an imaging apparatus according to a first embodiment and schematic diagrams illustrating polarization states of a first polarizing unit and a second polarizing unit;

FIGS. 2A and 2B are a conceptual diagram of light that passes through a first region in the first polarizing unit and a third region in the second polarizing unit and arrives at an imaging element array and a conceptual diagram of light that passes through a second region in the first polarizing unit and a fourth region in the second polarizing unit and arrives at the imaging element array, in the imaging apparatus according to the first embodiment, respectively, and FIGS. 2C and 2D are schematic diagrams illustrating images formed on the imaging element array by the light illustrated in FIGS. 2A and 2B;

FIGS. 3A and 3B are a schematic partial cross-sectional view of an imaging element in the imaging apparatus according to the first embodiment and a schematic diagram illustrating an arrangement state of a wire grid polarizer, respectively;

FIGS. 6A and 6B are schematic diagrams illustrating polarization states of a first polarizing unit and a second polarizing unit included in an imaging apparatus according to a second embodiment, respectively;

FIGS. 8A to 8D are a schematic diagram of a first polarizing unit included in an imaging apparatus according to a third embodiment;

FIGS. 10A to 10C are a conceptual diagram of an imaging apparatus according to a fifth embodiment and schematic diagrams illustrating polarization states of a first polarizing unit and a second polarizing unit;

FIGS. 11A to 11C are graphs illustrating calculation results of a relation between a pitch of wires forming a wire grid polarizer, a wavelength of incident light, and an extinction ratio, a relation between a height of wires forming the wire grid polarizer, a wavelength of incident light, and an extinction ratio, and a relation between (width/pitch) of wires forming the wire grid polarizer, a wavelength of incident light, and an extinction ratio, in a seventh embodiment, respectively;

FIGS. 15A to 15D are a conceptual diagram of an imaging apparatus according to a ninth embodiment, a conceptual diagram of a quarter-wave plate, a schematic diagram illustrating a polarization state of a first polarizing unit, and a schematic diagram illustrating a polarization state of a polarizing unit (second polarizing unit), respectively;

FIGS. 17A to 17C are a conceptual diagram of an imaging apparatus according to an eleventh embodiment and schematic diagrams illustrating polarization states of a first polarizing unit and a second polarizing unit;

FIGS. 18A and 18B are schematic partial cross-sectional views of lens systems in twelfth and thirteenth embodiments, respectively; and FIGS. 19A and 19B are schematic partial cross-sectional views of a modification of the imaging element.

DETAILED DESCRIPTION OF THE EMBODIMENT(S)

Figure 4:
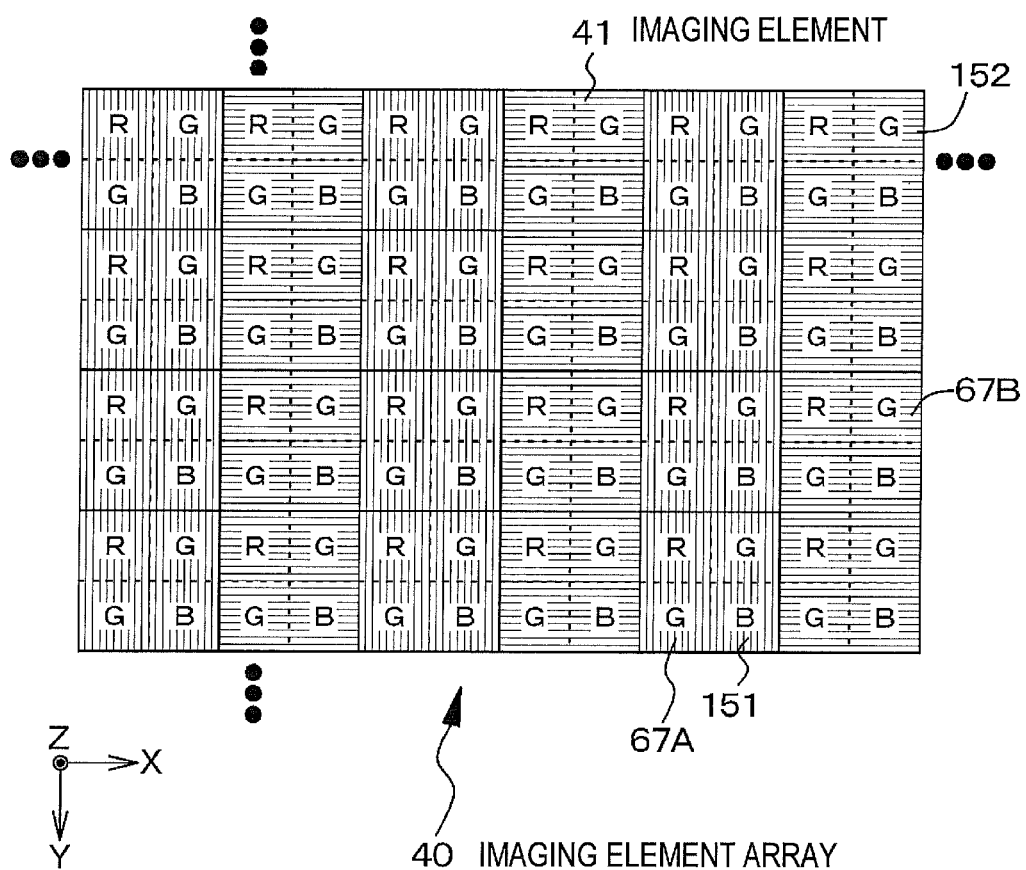
FIG. 4 is a conceptual diagram of the imaging element array having a Bayer arrangement in the imaging apparatus according to the first embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The following description will be made in the order described below.
1. Explanation about Whole of Imaging Apparatus and Imaging Method according to First and Second Aspects of Present Disclosure
2. First Embodiment (Imaging Apparatus and Imaging Method according to First Aspect of Present Disclosure)
3. Second Embodiment (Modification of First Embodiment)
4. Third Embodiment (Another Modification of First Embodiment)
5. Fourth Embodiment (Another Modification of First Embodiment)
6. Fifth Embodiment (Another Modification of First Embodiment)
7. Sixth Embodiment (Another Modification of First Embodiment)
8. Seventh Embodiment (Another Modification of First Embodiment)
9. Eighth Embodiment (Another Modification of First Embodiment)
10. Ninth Embodiment (Another Modification of First Embodiment)
11. Tenth Embodiment (Modification of Ninth Embodiment)
12. Eleventh Embodiment (Imaging Apparatus and Imaging Method according to Second Aspect of Present Disclosure)
13. Twelfth Embodiment (Modification of First to Eleventh Embodiments)
14. Thirteenth Embodiment (Modification of Twelfth Embodiment) and Others

[Explanation about Whole of Imaging Apparatus and Imaging Method according to First and Second Aspects of Present Disclosure]

In the following explanation, an imaging apparatus according to a first aspect of the present disclosure and an imaging apparatus suitable for an imaging method according to the first aspect of the present disclosure are generically called the "imaging apparatus according to the first aspect of the present disclosure", an imaging apparatus according to a second aspect of the present disclosure and an imaging apparatus suitable for an imaging method according to the second aspect of the present disclosure are generically called the "imaging apparatus according to the second aspect of the present disclosure", and imaging apparatuses according to the first and second aspects of the present disclosure and imaging apparatuses suitable for the imaging methods according to the first and second aspects of the present disclosure are generically called the "imaging apparatus of the present disclosure".

In the imaging apparatus of the present disclosure, a first polarizing unit is preferably arranged in the vicinity of a diaphragm unit of a lens system. Alternatively, when light incident on the lens system first becomes parallel light and is finally condensed (imaged) on an imaging element, the first polarizing unit is preferably arranged on a portion of the lens system in a state of the parallel light. In this configuration, generally, it is not necessary to design an optical system of the lens system again and a mechanical (physical) design change may be performed such that the first polarizing unit is fixed on an existing lens system or is mounted to the existing lens system to be removable. In order to mount the first polarizing unit to the lens system to be removable, the first polarizing unit is formed to have a configuration similar to a configuration of a diaphragm blade of a lens and may be arranged in the lens system. Alternatively, in the lens system, a member in which the first polarizing unit and an opening are provided is mounted to a rotation shaft parallel to an optical axis of the lens system to be rotatable about the rotation shaft and the member is rotated about the rotation shaft, so that a ray passing through the lens system passes through the opening or the first polarizing unit. Alternatively, in the lens system, the member in which the first polarizing unit and the opening are provided is mounted to the lens system to be slidable in a direction orthogonal to the optical axis of the lens system and the member is slid, so that a ray passing through the lens system passes through the opening or the first polarizing unit. In this case, the member in which the first polarizing unit and the opening are provided may be configured using one member or a plurality of member pieces.

Preferably, the lens system is configured using one single focus lens and a diaphragm unit arranged on a front surface or a front side (object side) of the single focus lens, that is, a front-diaphragm single focus lens and the first polarizing unit is arranged in the vicinity of the diaphragm unit of the lens system. The first polarizing unit is preferably mounted to the lens system to be removable. One single focus lens may be configured to include an imaging lens group and may be moved in a forward-to-backward direction with respect to an imaging element array as a whole. Thereby, one single focus lens preferably realizes an automatic focus function. The shortest distance between the first polarizing unit and one single focus lens is 0.6 mm or less, preferably, 0.05 to 0.6 mm.

In the imaging apparatus of the present disclosure including the preferred forms described above, in the first polarizing unit, a central region is provided between a first region and a second region and a polarization state of central region passing light that has passed through the central region does not change from a polarization state of light before being incident on the central region. That is, the central region is unrelated to the polarization. In the central region of the first polarizing unit, the light intensity is strong. However, the parallax amount is small. Therefore, the base-line length of binocular parallax having the sufficient length can be secured while the intensity of light received by the imaging element array is increased. When an external shape of the first polarizing unit is configured as a circular shape, the central region can be configured as a circular shape and the first region and the second region can be configured as a fan shape that surrounds the central region and has a center angle of 180 degrees or the central region can be configured as a square shape or a lozenge shape and the first region and the second region can be configured as a shape similar to the fan shape that surrounds the central region and has a center angle of 180 degrees. Alternatively, the first region, the central region, and the second region can be formed in shapes of bands that extend along a second direction.

In the imaging apparatus of the present disclosure including the various preferred embodiments described above, the first region and the second region can be formed using the polarizer and a direction of an electric field of first region passing light can be orthogonal to a direction of an electric field of second region passing light. In the imaging apparatus of the present disclosure including such a configuration, the direction of the electric field of the first region passing light can be parallel to the first direction, the direction of the electric field of the first region passing light can from with an angle of 45 degrees with the first direction, or the direction of the electric field of the first region passing light can form any angle (β) with the first direction. In the imaging apparatus according to the first aspect of the present disclosure including any combination of the configurations described above, the direction of the electric field of the first region passing light can be parallel to the direction of the electric field of the third region passing light and the direction of the electric field of the second region passing light can be parallel to a direction of an electric field of fourth region passing light. In the imaging apparatus according to the second aspect of the present disclosure including any combination of the configurations described above, the direction of the electric field of the first region passing light can be parallel to the direction of the electric field of the third region passing light. In the imaging apparatus of the present disclosure including any combination of the configurations described above, an extinction ratio of the polarizer is 3 or more, preferably, 10 or more.

In this case, the "polarization state" means a state of light in which an electric field and a magnetic field vibrate only in a specific direction and the "non-polarization state" means a state of light in which a polarization of light is not regular and a phase relation of electric field components orthogonal to each other is in disorder. The "polarizer" means an element that generates linearly polarized light from natural light (non-polarized light) or circularly polarized light and a polarizer that forms the first region and the second region may be a polarizer (polarizing plate) that has a well-known configuration. For example, a polarization component of one of the first region passing light and the second region passing light may be used mainly as an S wave (TE wave) and a polarization component of the other may be used mainly as a P wave (TM wave). Polarization states of the first region passing light and the second region passing light may be a linear polarization and a circular polarization (rotation directions are in a reverse relation mutually). In general, a transverse wave in which a vibration direction is only a specific direction is called a polarized wave and the vibration direction is called a polarization direction or a polarization axis. A direction of an electric field of light is matched with the polarization direction. The extinction ratio is a ratio of a component of light in which a direction of an electric field is the first direction and a component of light in which a direction of an electric field is the second direction, which are included in light passing through the first region, in the first region, and is a ratio of a component of light in which a direction of an electric field is the second direction and a component of light in which a direction of an electric field is the first direction, which are included in light passing through the second region, in the second region, when the direction of the electric field of the first region passing light is parallel to the first direction. The extinction ratio is a ratio of a component of light in which a direction of an electric field forms an angle of 45 degrees with the first direction and a component of light in which a direction of an electric field forms an angle of 135 degrees with the first direction, which are included in light passing through the first region, in the first region, and is a ratio of a component of light in which a component of light in which a direction of an electric field forms an angle of 135 degrees with the first direction and a direction of an electric field forms an angle of 45 degrees with the first direction, which are included in light passing through the second region, in the second region, when the direction of the electric field of the first region passing light forms an angle of 45 degrees with the first direction. The extinction ratio is a ratio of a component of light in which a direction of an electric field forms an angle of β degrees with the first direction and a component of light in which a direction of an electric field forms an angle of (β+90) degrees with the first direction, which are included in light passing through the first region, in the first region, and is a ratio of a component of light in which a component of light in which a direction of an electric field forms an angle of (β+90) degrees with the first direction and a direction of an electric field forms an angle of β degrees with the first direction, which are included in light passing through the second region, in the second region, when the direction of the electric field of the first region passing light forms any angle (β degrees) with the first direction. The extinction ratio is a ratio of the P polarization component and the S polarization component included in the first region passing light, in the first region, and is a ratio of the S polarization component and the P polarization component included in the second region passing light, in the second region, when the polarization component of the first region passing light is mainly the P wave and the polarization component of the second region passing light is mainly the S wave.

In the imaging apparatus according to the first aspect of the present disclosure including the various preferred forms and configurations described above, the imaging element is formed by stacking a color filter, an on-chip lens, and a wire grid polarizer on or above a photoelectric conversion element and the wire grid polarizer can form the third region and the fourth region. Alternatively, the imaging element is formed by stacking the wire grid polarizer, the color filter, and the on-chip lens on or above the photoelectric conversion element and the wire grid polarizer can form the third region and the fourth region. Alternatively, the imaging element is formed by stacking the on-chip lens, the color filter, and the wire grid polarizer on or above the photoelectric conversion element and the wire grid polarizer can form a third region and a fourth region. However, the stacked order of the on-chip lens, the color filter, and the wire grid polarizer can be appropriately changed. In this configuration, when the direction of the electric field of the first region passing light is parallel to the first direction, an extension direction of a plurality of wires that form the wire grid polarizer can be parallel to the first direction or the second direction. Specifically, the extension direction of the wires is parallel to the second direction in the wire grid polarizer that forms the third region and the extension direction of the wires is parallel to the first direction in the wire grid polarizer that forms the fourth region. In this configuration, when the direction of the electric field of the first region passing light forms an angle of 45 degrees with the first direction, the extension direction of the plurality of wires that form the wire grid polarizer can form an angle of 45 degrees with the first direction or the second direction. Specifically, the extension direction of the wires forms an angle of 135 degrees with the first direction in the wire grid polarizer that forms the third region and the extension direction of the wires forms an angle of 45 degrees with the first direction in the wire grid polarizer that forms the fourth region. The extension direction of the wires becomes a light absorption axis in the wire grid polarizer and a direction orthogonal to the extension direction of the wires becomes a light transmission axis in the wire grid polarizer. The above configuration is basically applicable to the imaging apparatus according to the second aspect of the present disclosure, except for the fourth region.

In the imaging apparatus according to the first aspect of the present disclosure including the various preferred forms and configurations described above, a quarter-wave plate (λ/4 wave plate) is preferably arranged on a light incident side of the first polarizing unit to prevent so-called binocular rivalry from being generated. The quarter-wave plate may be arranged at all times and may be arranged, if necessary. Specifically, the quarter-wave plate may be mounted to a filter mounting portion provided in a lens system to be removable. In this case, the binocular rivalry means a phenomenon in which a fusion does not occur, only one image is superior, and the images are viewed alternately or suppress each other in an overlapped region, when an image obtained from a P-wave component and an image obtained from an S-wave are provided to both eyes, in the case in which an object such as a surface of water or a window that reflects the P-wave component, but absorbs the S-wave component is imaged. A polarization direction of light that has passed through the quarter-wave plate is aligned. In an image obtained when the light passes through the first region and the third region and arrives at the imaging element array and an image obtained when the light passes through the second region and the fourth region and arrives at the imaging element array, the large difference is not generated between images of portions of an object that reflects the P-wave component, but absorbs the S-wave component, and the binocular rivalry can be prevented from being generated. A fast axis of the quarter-wave plate preferably forms an angle of 45 degrees or an angle of 45 degrees±10 degrees with the direction of the electric field of the first region passing light.

As described above, in the imaging apparatus according to the first aspect of the present disclosure, in the configuration in which each of the first region and the second region is configured using the polarizer, the direction of the electric field of the first region passing light is orthogonal to the direction of the electric field of the second region passing light, and the direction of the electric field of the first region passing light is parallel to the first direction or the direction of the electric field of the first region passing light forms an angle of 45 degrees with the first direction, the quarter-wave plate is arranged on the light incident side of the first polarizing unit, the fast axis of the quarter-wave plate can form a predetermined angle with the direction of the electric field of the first region passing light, the quarter-wave plate includes a first quarter-wave plate and a second quarter-wave plate that are arranged along the first direction or the second direction, a fast axis of the first quarter-wave plate can form a predetermined angle with the direction of the electric field of the first region passing light, and a fast axis of the second quarter-wave plate can be orthogonal to the fast axis of the first quarter-wave plate (in other words, the fast axis of the second quarter-wave plate is parallel to a slow axis of the first quarter-wave plate). In this configuration, the predetermined angle may be 45 degrees or 45 degrees±10 degrees. In this configuration, the direction of the electric field of the first region passing light can be parallel to the direction of the electric field of the third region passing light and the direction of the electric field of the second region passing light can be parallel to the direction of the electric field of the fourth region passing light. In this configuration, the first polarizing unit can be mounted to the lens system to be removable and the quarter-wave plate can be mounted to the lens system to be removable. In this configuration, the quarter-wave plate can be arranged on the light incident side of the first polarizing unit to be adjacent to the first polarizing unit.

In order to mount the quarter-wave plate to the lens system to be removable, the quarter-wave plate may be formed to have a configuration similar to a configuration of a diaphragm blade of a lens and may be arranged in the lens system. Alternatively, in the lens system, a member in which the quarter-wave plate and an opening are provided is mounted to a rotation shaft parallel to an optical axis of the lens system to be rotatable about the rotation shaft and the member is rotated about the rotation shaft, so that light passing through the lens system passes through the opening or the quarter-wave plate. Alternatively, in the lens system, the member in which the quarter-wave plate and the opening are provided is mounted to the lens system to be slidable in a direction orthogonal to the optical axis of the lens system and the member is slid, so that light passing through the lens system passes through the opening or the quarter-wave plate. In this case, the quarter-wave plate may be configured using a plurality of members and each member may be slid in a direction orthogonal to an optical axis of the lens system.

In the imaging apparatus according to the first aspect of the present disclosure, in order to prevent the so-called binocular rivalry from being generated, a polarizing plate that has a polarization axis of α degrees can be arranged on the light incident side of the first polarizing unit, the first region can be configured using the first wave plate, the second region can be configured using the second wave plate, and the direction of the electric field of the first region passing light can be orthogonal to the direction of the electric field of the second region passing light. Specifically, a value of α is 45 degrees, the first wave plate can be configured using a half-wave plate (λ/2 wave plate), and the second wave plate can be configured using a half-wave plate (−λ/2 wave plate) that is different from the half-wave plate forming the first wave plate in a phase difference. In this case, the polarizing plate that has the polarization axis of α degrees is fixed on the lens system.

In the imaging method according to the second aspect of the present disclosure, an electric signal (it may be called a first electric signal, for the convenience of explanation) to obtain one image of the right eye image and the left eye image is generated in the imaging element, by the first region passing light that passes through the third region and arrives at the imaging element. In addition, an electric signal (it may be called a second electric signal, for the convenience of explanation) to obtain the other image of the right eye image and the left eye image is generated in the imaging element, by the first region passing light and the second region passing light that pass through the fourth region and arrive at the imaging element. However, in the imaging apparatus, brightness is preferably adjusted in the right eye image data and the left eye image data (or the left eye image data and the right eye image data) obtained on the basis of the first electric signal and the second electric signal and the brightness of the right eye image and the brightness of the left eye image are preferably optimized.

In the imaging apparatus according to the first aspect of the present disclosure including the various preferred forms and configurations described above, the imaging element array has a Bayer arrangement, one pixel includes four imaging elements, and one third region and/or one fourth region can be arranged with respect to one pixel. In the imaging apparatus according to the first aspect of the present disclosure including the various preferred forms and configurations described above, one third region and one fourth region can be arranged with respect to N pixels (N is 2n and n is a natural number of 1 to 5) along a first direction. However, the arrangement of the imaging element array is not limited to the Bayer arrangement and may be an interline arrangement, a G stripe RB checkered arrangement, a G stripe RB complete checkered arrangement, a checker complementary color arrangement, a stripe arrangement, an oblique stripe arrangement, a primary color difference arrangement, a field color difference sequential arrangement, a frame color difference sequential arrangement, a MOS-type arrangement, an improved MOS-type arrangement, a frame interleaved arrangement, and a field interleaved arrangement. The above configuration is basically applicable to the imaging apparatus according to the second aspect of the present disclosure.

In the imaging method according to the first aspect or the second aspect of the present disclosure using the imaging apparatus of the present disclosure including the various preferred embodiments and configurations described above, one third region and one fourth region can be arranged with respect to N pixels (N is 2n and n is a natural number of 1 to 5) along a first direction. In this case, image data (right eye image data) to obtain a right eye image and image data (left eye image data) to obtain a left eye image can be obtained on the basis of a depth map (depth information) generated from an electric signal obtained by first region passing light passed through the third region and an electric signal obtained by second region passing light passed through the fourth region (imaging method according to the first aspect of the present disclosure) or electric signals obtained by the first region passing light and the second region passing light passed through the fourth region (imaging method according to the second aspect of the present disclosure) and electric signals from all of imaging elements forming an imaging element array.

In the imaging apparatus according to the first aspect of the present disclosure, when the arrangement of the imaging element array is set to the Bayer arrangement, the third region and the fourth region may not be arranged in a red imaging element to receive red light and a blue imaging element to receive blue light, the third region may be arranged in one of two green imaging elements to receive green light, and the fourth region may be arranged in the other green imaging element. Alternatively, when the arrangement of the imaging element array is set to the Bayer arrangement, the third region or the fourth region may be arranged in the two imaging elements (for example, one red imaging element to receive red light and one green imaging element to receive green light) adjacent in a first direction among one red imaging element to receive red light, one blue imaging element to receive blue light, and two green imaging elements to receive green light, and the fourth region or the third region may be arranged in the remaining two imaging elements (for example, a blue imaging element to receive blue light and the other green imaging element to receive green light). Alternatively, when the arrangement of the imaging element array is set to the Bayer arrangement, the third region or the fourth region may be arranged in one imaging element (for example, one red imaging element to receive red light or one blue imaging element to receive blue light) among one red imaging element to receive red light, one blue imaging element to receive blue light, and two green imaging elements to receive green light and the fourth region or the third region may be arranged in the imaging element (for example, green imaging element) adjacent to the imaging element in the first direction. Even in this case, one third region and one fourth region can be arranged with respect to N pixels along the second direction and one third region or one fourth region can be arranged with respect to M pixels along the first direction. The above configuration is basically applicable to the imaging apparatus according to the second aspect of the present disclosure.

In the imaging apparatuses and the imaging methods (hereinafter, they may be generically called the present disclosure) according to the first aspect and the second aspect of the present disclosure including the various preferred embodiments and configurations described above, the first direction can be set to the horizontal direction and the second direction can be set to the vertical direction. A unit length of the third region and the fourth region along the second direction may be equal to the length of the imaging element along the second direction (when the direction of the electric field of the first region passing light is parallel to the first direction) or may be equal to a length of one imaging element (when the direction of the electric field of the first region passing light forms an angle of 45 degrees with the first direction). The lens system may be configured as a single focus lens or a zoom lens and a configuration of the lens or the lens system may be determined on the basis of the specifications of the lens system. As the imaging element, a CCD sensor, a CMOS sensor, and a signal amplifying image sensor of a charge modulation device (CMD) type may be used. As the imaging apparatus, a solid-state imaging apparatus of a surface irradiation type or a solid-state imaging apparatus of a back surface irradiation type may be used. A digital still camera, a video camera, a camcorder, and a camera-attached mobile phone can be configured using the imaging apparatus according to the first aspect or the second aspect.

In the case in which the third region and the fourth region are configured using the wire grid polarizer in the imaging apparatus according to the first aspect of the present disclosure or when the third region is configured using the wire grid polarizer in the imaging apparatus according to the second aspect of the present disclosure, although a formation material of wires forming the wire grid polarizer is not limited to a specific material, the formation material is preferably aluminum (Al) and an aluminum alloy, a value of a ratio [(width of wires)/(pitch of wires)] between the width of the wires and a pitch of the wires is preferably 0.33 or more, the height of the wires is preferably $5 \times 10^{-8}$ m or more, and the number of wires is preferably 10 or more.

In the imaging apparatus according to the first aspect of the present disclosure, a center of gravity point of the first region indicates a center of gravity point calculated on the basis of an external shape of the first region and a center of gravity point of the second region indicates a center of gravity point calculated on the basis of an external shape of the second region. When an external shape (entrance pupil diameter) of the first polarizing unit is configured as a circular shape having a radius r and each the first region and the second region is formed to have a shape of a half-moon occupying half of the first polarizing unit, the distance between the center of gravity point of the first region and the center of gravity point of the second region can be obtained from a simple calculation $[(8r)/(3\pi)]$. In the imaging apparatus according to the second aspect of the present disclosure, a center of gravity point of the first region indicates a center of gravity point calculated on the basis of an external shape of the first region and a center of gravity point of the first polarizing unit indicates a center of gravity point calculated on the basis of an external shape (entrance pupil diameter) of the first polarizing unit. When an external shape (entrance pupil diameter) of the first polarizing unit is configured as a circular shape having a radius r and each the first region and the second region is formed to have a shape of a half-moon occupying half of the first polarizing unit, the distance between the center of gravity point of the first region and the center of gravity point of the first polarizing unit can be obtained from a simple calculation $[(4r)/(3\pi)]$.

[First Embodiment]

A first embodiment relates to an imaging apparatus and an imaging method according to a first aspect of the present disclosure and more particularly, to an imaging apparatus and an imaging method to image an object as a stereoscopic image.

A conceptual diagram of an imaging apparatus according to a first embodiment is illustrated in FIG. 1A, schematic diagrams illustrating polarization states of a first polarizing unit and a second polarizing unit are illustrated in FIGS. 1B and 1C, respectively, a conceptual diagram of light that passes through a lens system, a first region in the first polarizing unit, and a third region in the second polarizing unit and arrives at an imaging element array is illustrated in FIG. 2A, a conceptual diagram of light that passes through a second region in the first polarizing unit and a fourth region in the second polarizing unit and arrives at the imaging element array is illustrated in FIG. 2B, and schematic diagrams illustrating images formed on the imaging element array by the light illustrated in FIGS. 2A and 2B are illustrated in FIGS. 2C and 2D, respectively. In the following description, an advancement direction of light is defined as a Z-axis direction, a first direction is defined as a horizontal direction (X-axis direction), and a second direction is defined as a vertical direction (Y-axis direction).

Each of imaging apparatuses according to the first embodiment and second to tenth embodiments to be described below includes (A) one of first polarizing units 130, 230, 330, 430, 530, and 930 that polarize light from an object, (B) a lens system 20 that condenses light from one of the first polarizing units 130, 230, 330, 430, 530, and 930, and (C) an imaging element array 40 that has imaging elements 41 arranged in a matrix of the first direction (horizontal direction and X-axis direction) and the second direction (vertical direction and Y-axis direction) orthogonal to the first direction, has one of second polarizing units 150 and 250 arranged on a light incident side, and converts the light condensed by the lens system 20 into an electric signal.

In the imaging apparatuses according to the first embodiment and the second to tenth embodiments to be described below, the first polarizing units 130, 230, 330, 430, 530, and 930 have first regions 131, 231, 331, 531, and 931 and second regions 132, 232, 332, 532, and 932 arranged along the first direction (horizontal direction and X-axis direction).

A polarization state of first region passing light $L_1$ that is passed through the first regions 131, 231, 331, 531, and 931 is different from a polarization state of second region passing light $L_2$ that is passed through the second regions 132, 232, 332, 532, and 932.

The second polarizing units 150 and 250 have a plurality of third regions 151 and 251 and a plurality of fourth regions 152 and 252 that are arranged alternately along the first direction (horizontal direction and X-axis direction) and extend in the second direction (vertical direction and Y-axis direction).

A polarization state of third region passing light $L_3$ that is passed through the third regions 151 and 251 is different from a polarization state of fourth region passing light $L_4$ that is passed through the fourth regions 152 and 252.

The first region passing light $L_1$ passes through the third regions 151 and 251 and arrives at the imaging element 41 and the second region passing light $L_2$ passes through the fourth regions 152 and 252 and arrives at the imaging element 41, thereby imaging an image to obtain a stereoscopic image in which the distance between a center of gravity point $BC_1$ of the first regions 131, 231, 331, 531, and 931 and a center of gravity point $BC_2$ of the second regions 132, 232, 332, 532, and 932 is set as a base-line length of binocular parallax.

In this case, in the imaging apparatuses according to the first embodiment and the second to eleventh embodiments to be described below, the lens system 20 includes an imaging lens 21, a diaphragm unit 22, and an image forming lens 23 and functions as a zoom lens. The imaging lens 21 is a lens that is used to condense incident light from the object. The imaging lens 21 includes a focus lens to perform focusing or a zoom lens to enlarge the object and is realized by a combination of a plurality of lenses to correct chromatic aberration. The diaphragm unit 22 has a narrowing function to adjust an amount of the condensed light and is generally configured by combining a plurality of sheet-like blades. At a position of at least the diaphragm unit 22, light from one point of the object becomes parallel light. The image forming lens 23 images light passed through the first polarizing units 130, 230, 330, 430, 530, 930, and 1130 on the imaging element array 40. The imaging element array 40 is arranged in a camera body 11. In the configuration described above, an entrance pupil is positioned to be closer to the camera body than the image forming lens 23. The imaging apparatus forms a digital still camera, a video camera, or a camcorder.

The camera body 11 includes an image processing unit 12 and an image storage unit 13, in addition to the imaging element array 40. Right eye image data and left eye image data are generated on the basis of the electric signals converted by the imaging element array 40. The imaging element array 40 is realized by a charge coupled device (CCD) or a complementary metal oxide semiconductor (CMOS) image sensor. The image processing unit 12 converts the electric signals output from the imaging element array 40 into the right eye image data and the left eye image data and records the image data in the image storage unit 13.

The first polarizing units 130, 230, 330, 430, 530, 930, and 1130 are arranged in the vicinity of the diaphragm unit 22 of the lens system 20. Specifically, the first polarizing units 130, 230, 330, 430, 530, 930, and 1130 are arranged at positions closer to the diaphragm unit 22, as long as the first polarizing units do not hinder activation of the diaphragm unit 22. As described above, the first polarizing units 130, 230, 330, 430, 530, 930, and 1130 are arranged in a portion of the lens system 20 in a state of the parallel light, when the light incident on the lens system 20 first becomes the parallel light and is finally condensed (imaged) on the imaging element 41.

In the imaging apparatus 110 according to the first embodiment, the first polarizing unit 130 includes the first region 131 and the second region 132. Specifically, an external shape of the first polarizing unit 130 is a circular shape and each of the first region 131 and the second region 132 has an external shape of a half-moon that occupies half of the first polarizing unit 130. A boundary line of the first region 131 and the second region 132 extends along the second direction. The first polarizing unit 130 that is formed by combining two polarization filters separates a polarization state of incident light into two different polarization states. As described above, the first polarizing unit 130 is configured using the bilaterally symmetric polarizers and generates polarizations of linear directions to be orthogonal to each other or polarizations of rotation directions to be reversed to each other at left and right two positions with respect to an erected state of a camera. The first region 131 is a filter that performs polarization with respect to an image of the object to be viewed by a right eye (light to be received by the right eye). Meanwhile, the second region 132 is a filter that performs polarization with respect to an image of the object to be viewed by a left eye (light to be received by the left eye).

In the imaging apparatus 110 according to the first embodiment, each of the first region 131 and the second region 132 is configured using the polarizer. A direction (shown by a void arrow) of an electric field of the first region passing light $L_1$ is orthogonal to a direction (shown by a void arrow) of an electric field of the second region passing light $L_2$ (refer to FIG. 1B). In the first embodiment, the direction of the electric field of the first region passing light $L_1$ is parallel to the first direction. Specifically, the first region passing light $L_1$ mainly has a P wave (TM wave) as a polarization component and the second region passing light $L_2$ mainly has an S wave (TE wave) as a polarization component. The direction of the electric field of the first region passing light $L_1$ is parallel to a direction (shown by a void arrow) of an electric field of the third region passing light $L_3$ and the direction of the electric field of the second region passing light $L_2$ is parallel to a direction (shown by a void arrow) of an electric field of the fourth region passing light $L_4$ (refer to FIG. 1C). An extinction ratio of each polarizer is 3 or more, specifically, 10 or more.

In the imaging apparatus 110 according to the first embodiment, an external shape of the first polarizing unit 130 is configured as a circular shape that has a radius r=10 mm. Each of the first region 131 and the second region 132 is formed to have a shape of a half-moon that occupies half of the first polarizing unit 130. Therefore, the distance between the center of gravity point $BC_1$ of the first region 131 and the center of gravity point $BC_2$ of the second region 132 is $[(8r)/(3\pi)]=8.5$ mM.

As illustrated in FIG. 3A to be a schematic partial cross-sectional view and FIG. 3B to be a schematic diagram of an arrangement state of a wire grid polarizer 67, the imaging element 41 is formed by stacking a first flattening film 62, a color filter 63, an on-chip lens 64, a second flattening film 65, an inorganic insulating base layer 66, and the wire grid polarizer 67 on a photoelectric conversion element 61 provided in a silicon semiconductor substrate 60. The wire grid polarizer 67 forms each of the third region 151 and the fourth region 152. In FIG. 3B, a boundary region of pixels is shown by a solid line. An extension direction of a plurality of wires 68 that form the wire grid polarizer 67 is parallel to the first direction or the second direction. Specifically, in a wire grid polarizer 67A that forms the third region 151, an extension direction of wires 68A is parallel to the second direction. In a wire grid polarizer 67B that forms the fourth region 152, an extension direction of wires 68B is parallel to the first direction. The extension direction of the wires 68 becomes a light absorption axis in the wire grid polarizer 67 and a direction orthogonal to the extension direction of the wires 68 becomes a light transmission axis in the wire grid polarizer 67.

In an imaging method according to the first embodiment, an electric signal to obtain the right eye image data is generated in the imaging element 41, by the first region passing light $L_1$ that passes through the third region 151 and arrives at the imaging element 41. In addition, an electric signal to obtain the left eye image data is generated in the imaging element 41, by the second region passing light $L_2$ that passes through the fourth region 152 and arrives at the imaging element 41. The electric signals are output simultaneously or alternately in time series. The image processing unit 12 executes image processing with respect to the output electric signals (electric signals to obtain the right eye image data and the left eye image data, which are output from the imaging element array 40) and the electric signals are recorded as the right eye image data and the left eye image data in the image storage unit 13.

As illustrated schematically in FIGS. 2A and 2B, lenses of the lens system 20 are focused on a square object A. In addition, a round object B is positioned to be closer to the lens system 20 than the object A. An image of the square object A is formed on the imaging element array 40 in a state in which the square object is focused. An image of the round object B is formed on the imaging element array 40 in a state in which the object is not focused. In an example illustrated in FIG. 2A, the image of the object B is formed at a position apart from a right side of the objet A by a distance (+ΔX), on the imaging element array 40. Meanwhile, in an example illustrated in FIG. 2B, the image of the object B is formed at a position apart from the left side of the object A by a distance (−ΔX), on the imaging element array 40. Therefore, a distance (2×ΔX) becomes information regarding a depth of the object B. That is, a blur amount and a blur direction of the object that is positioned to be closer to the imaging apparatus than the object A become different from a blur amount and a blur direction of the object positioned to be farther from the imaging apparatus and the blur amount of the object B is different according to a distance between the object A and the object B. In addition, a stereoscopic image in which a distance between center of gravity positions of the shapes of the first region 131 and the second region 132 in the first polarizing unit 130 is set as a base-line length of binocular parallax can be obtained. That is, a stereoscopic image can be obtained from the right eye image (refer to the schematic diagram of FIG. 2C) and the left eye image (refer to the schematic diagram of FIG. 2D) obtained in the above-described manner, on the basis of a well-known method. If the right eye image data and the left eye image data are synthesized with each other, instead of the stereoscopic image, a normal two-dimensional (plane) image can be obtained.

As illustrated in FIG. 4 to be a conceptual diagram, in the first embodiment, the imaging element array 40 has a Bayer arrangement and one pixel includes four imaging elements (one red imaging element R to receive red light, one blue imaging element B to receive blue light, and two green imaging elements G to receive green light). The third region 151 is arranged with respect to a pixel group of one column that extends in the second direction. Likewise, the fourth region 152 is arranged with respect to a pixel group of one column that is adjacent to the pixel group in the first direction and extends in the second direction. The third region 151 and the fourth region 152 are arranged alternately along the first direction. The third region 151 and the fourth region 152 extend in the second direction as a whole. However, unit lengths of the third region 151 and the fourth region 152 along the first direction and the second direction are equal to lengths of the imaging element 41 along the first direction and the second direction. By this configuration, an image (right eye image) of a band shape that is based on the light mainly having the P-wave component and extends in the second direction and an image (left eye image) of a band shape that is based on the light mainly having the S-wave component and extends in the second direction are generated alternately along the first direction. In FIG. 4, longitudinal lines are drawn in the third region 151 and transverse lines are drawn in the fourth region 152. The longitudinal lines and the transverse lines schematically show the wires of the wire grid polarizers 67A and 67B.

As described above, the electric signals to obtain the right eye image data and the left eye image data are generated in a missing state, along the first direction. Therefore, the image processing unit 12 executes demosaicking processing and interpolation processing based on super-resolution processing with respect to the electric signals to generate the right eye image data and the left eye image data, thereby finally generating the right eye image data and the left eye image data. For example, the parallax can be emphasized or can be made to become appropriate, using parallax detection technology for generating a disparity map from the left eye image data and the right eye image data by stereo matching and parallax control technology for controlling the parallax on the basis of the disparity map.

Figure 5:
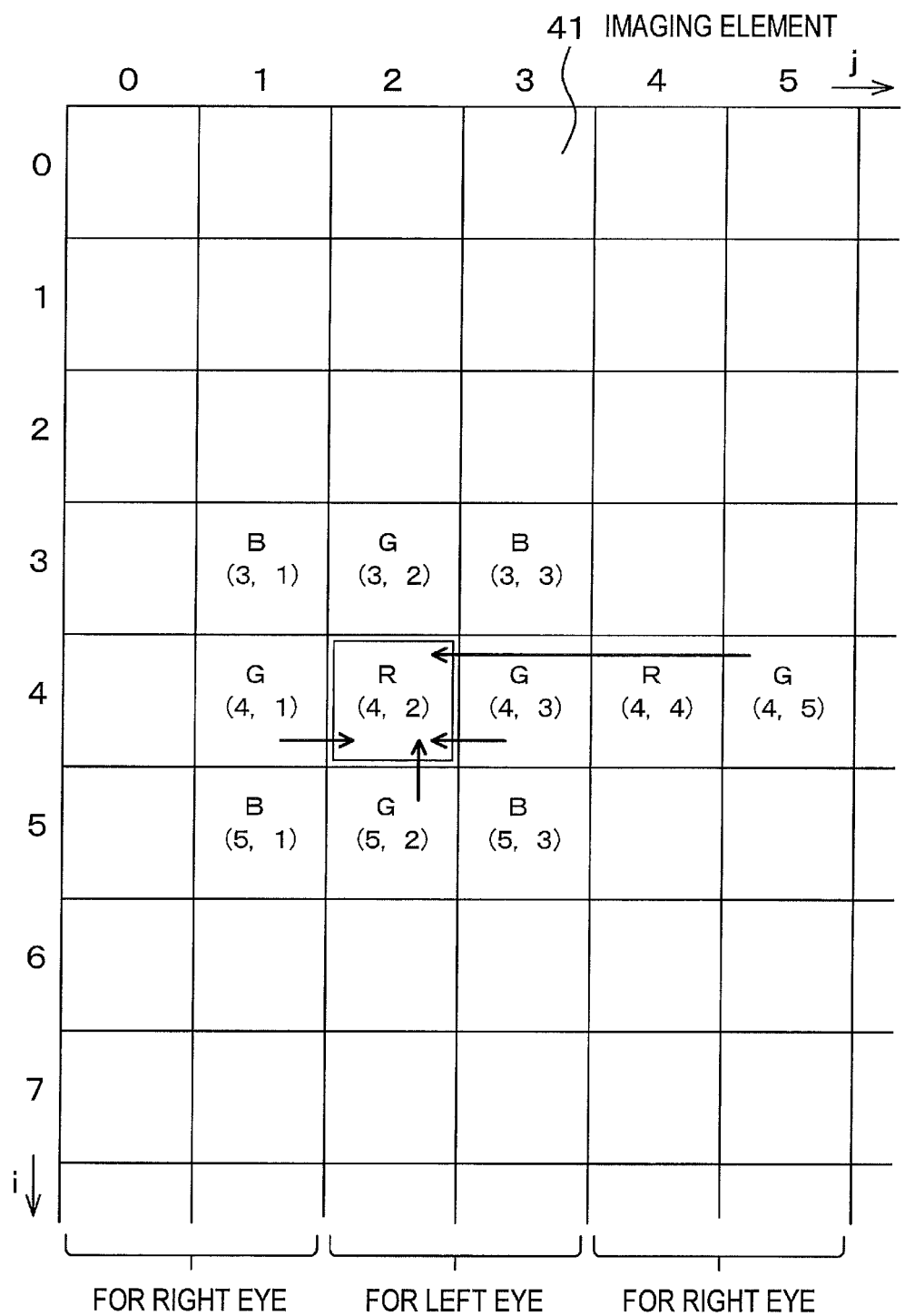
FIG. 5 is a conceptual diagram of the imaging element array having the Bayer arrangement to illustrate image processing for executing demosaicking processing with respect to an electric signal obtained from an imaging element and obtaining a signal value.

FIG. 5 is a conceptual diagram of the imaging element array having the Bayer arrangement to illustrate image processing (mosaicking processing) for executing demosaicking processing with respect to an electric signal obtained from an imaging element and obtaining a signal value. FIG. 5 illustrates an example of the case in which a signal value regarding the green imaging element in the left eye image is generated. In normal demosaicking processing, a mean value of electric signals of surrounding imaging elements of the same color is generally used. However, as described in the first embodiment, in the case in which the pixel group (pixel column) to obtain the right eye image data and the pixel group (pixel column) to obtain the left eye image data are alternately repeated, if the mean value of the electric signals of the surrounding imaging elements is used without a change, original image data may not be obtained. Therefore, the demosaicking processing is executed after considering which of the right eye image data and the left eye image data corresponds to the electric signals of the imaging elements to be referred to.

In the Bayer arrangement, it is assumed that a red imaging element R is arranged at a position (4, 2). At this time, in order to generate a green imaging element signal value g' corresponding to the position (4, 2), an operation that is represented by the following expression is performed.

$$g'_{4,2}=(g_{4,1}+g_{4,3}+g_{5,2}+g_{4,5}\times W_3)/(3.0+W_3)$$

In this case, $g'_{i,j}$ of a left side shows a green imaging element signal value at a position (i, j). In addition, $g_{i,j}$ of a right side shows a value of an electric signal of the green imaging element at the position (i, j). In addition, "3.0" shows a value that corresponds to a value obtained by, when distances ($W_1$) from an attention imaging element $G_{4,2}$ to neighboring imaging elements $G_{4,1}$, $G_{4,3}$, and $G_{5,2}$ are "1.0", respectively, setting inverse numbers thereof as weights and calculating a total sum of the weights. Likewise, $W_3$ is a weight with respect to a value of an electric signal of an imaging element $G_{4,5}$ apart from the corresponding imaging element by three imaging elements. In this case, $W_3$ is "1/3". Generalization of the above expression becomes the following expression.

In the case in which i is an even number (signal value of a green imaging element G that corresponds to a position of a red imaging element R): $g'_{i,j}=(g_{i,j-1}\times W_1+g_{i,j+1}\times W_1+g_{i+1,j}\times W_1\times g_{i,j+3}\times W_3)/(W_1+3.0\times W_3)$ In the case in which i is an odd number (signal value of a green imaging element G that corresponds to a position of a blue imaging element B): $g'_{i,j}=(g_{i,j-1}\times W_1+g_{i,j+1}\times W_1+g_{i-1,j}\times W_1+g_{i,j-3}\times W_3)/(W_1\times 3.0+W_3)$ In this case, $W_1=1.0$ and $W_3=1/3$ are satisfied.

The demosaicking processing can be executed with respect to the red imaging element R and the blue imaging element B, in the same manner as the above case.

The imaging element signal value at the position of each imaging element can be obtained by the demosaicking processing. In this step, however, a signal enters a missing state, as described above. For this reason, with respect to a region where there is no imaging element signal value, an imaging element signal value should be generated by interpolation. As an interpolation method, a well-known method such as a method using an added means value of values of electric signals of neighboring imaging elements may be used. The interpolation processing may be executed in parallel to the demosaicking processing. Because an image quality is securely maintained in the second direction, image quality deterioration such as resolution reduction of an entire image is relatively small.

In the first embodiment, because the imaging apparatus 110 can be configured using one set of the first polarizing unit 130 and the second polarizing unit 150 and one lens system 20, two different images that are separated laterally can be generated at the same time and a small imaging apparatus that has a monocular simple configuration and has a small number of structural elements can be provided. Because two sets of combinations of lenses and polarization filters are not necessary, a deviation or a difference does not occur in zooming, a diaphragm unit, focusing, and a convergence angle. Because the base-line length of the binocular parallax is relatively short, a natural stereoscopic effect can be obtained. If the first polarizing unit 130 is configured to be removable, a two-dimensional image and a three-dimensional image can be easily obtained.

[Second Embodiment]

A second embodiment is a modification of the first embodiment. In the first embodiment, the direction of the electric field of the first region passing light $L_1$ is parallel to the first direction. Meanwhile, in the second embodiment, the direction of the electric field of the first region passing light $L_1$ forms an angle of 45 degrees with the first direction. Polarization states of a first polarizing unit 230 and a second polarizing unit 250 that are included in an imaging apparatus according to the second embodiment are schematically illustrated in FIGS. 6A and 6B.

Figure 7:
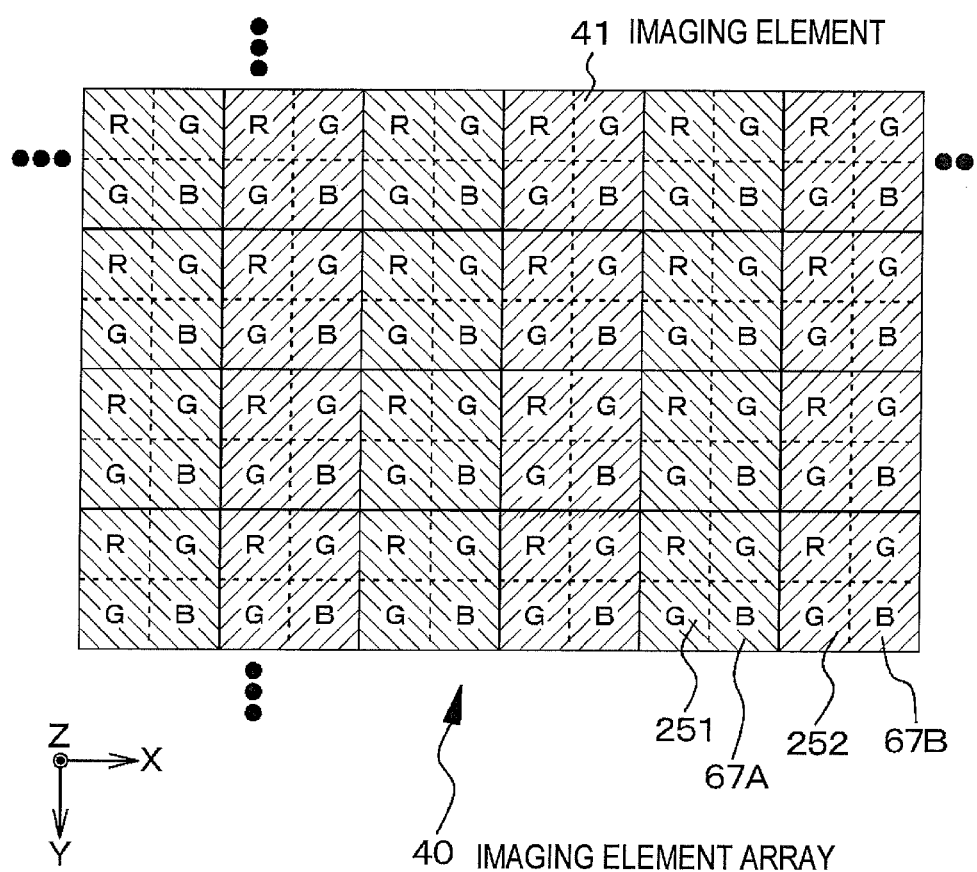
FIG. 7 is a conceptual diagram of an imaging element array having a Bayer arrangement in the imaging apparatus according to the second embodiment.

A conceptual diagram of the imaging element array 40 that has a Bayer arrangement is illustrated in FIG. 7. Even in the second embodiment, in an imaging element array 40, one pixel includes four imaging elements (one red imaging element R to receive red light, one blue imaging element B to receive blue light, and two green imaging elements G to receive green light). A third region 251 is arranged with respect to a pixel group of one column that extends in the second direction. Likewise, a fourth region 252 is arranged with respect to a pixel group of one column that is adjacent to the pixel group in the first direction and extends in the second direction. The third region 251 and the fourth region 252 are arranged alternately along the first direction. The third region 251 and the fourth region 252 extend in the second direction as a whole. However, unit lengths of the third region 251 and the fourth region 252 are equal to a length of one imaging element. By this configuration, an image (right eye image) of a band shape that is based on the light mainly having the P-wave component and extends in the second direction and an image (left eye image) of a band shape that is based on the light mainly having the S-wave component and extends in the second direction are generated alternately along the first direction. In FIG. 7, oblique lines are drawn in the third region 251 and the fourth region 252. The oblique lines schematically show the wires of the wire grid polarizer.

The configuration of the imaging apparatus according to the second embodiment is the same as the configuration of the imaging apparatus 110 according to the first embodiment, except for the partial configuration described above. Therefore, repeated explanation of the configuration of the imaging apparatus is omitted. The configuration of the imaging apparatus according to the second embodiment is applicable to the imaging apparatuses according to the third to eleventh embodiments to be described below.

[Third Embodiment]

A third embodiment is also a modification of the first embodiment. In an imaging apparatus according to the third embodiment, in a first polarizing unit 330, a central region 333 is provided between a first region 331 and a second region 332 and a polarization state of central region passing light that has passed through the central region 333 does not change from a polarization state of light before being incident on the central region 333. That is, the central region 333 is unrelated to the polarization.

Meanwhile, when incident light passes through the first polarizing unit, a light amount decreases in proportion to a spectral characteristic and an extinction ratio and brightness thereof becomes dark. In this case, the extinction ratio is a ratio of an amount of light to be selected and passed by a polarizer and a leaking amount of light not to be selected by the polarizer and to be reflected or absorbed. Specifically, in the case of a polarizer that passes a P-wave component with an extinction ratio 10, with respect to the intensity 100 of incident natural light of P-wave component: S-wave component=50:50, the polarizer transmits the light with a ratio of P-wave component:S-wave component=50:5. In the case of a polarizer that passes a P-wave component with an extinction ratio $\infty$, the polarizer completely transmits the P-wave component and totally reflects the S-wave component or completely absorbs the S-wave component and does not transmit the S-wave component. For this reason, when average natural light is incident, brightness thereof becomes about ½. Even though transmission loss is zero in the amount of light passed through each of the first polarizing unit 130 and the second polarizing unit 150 illustrated in FIGS. 1B and 1C, the light amount may become about 25% of the amount of light before being incident on the first polarizing unit 130. When the light passed through the first region and the second region is synthesized and is incident on the imaging element array 40 in a non-separated state, the base-line length of the binocular parallax decreases in proportion to a synthesis ratio. The left eye image and the right eye image become the same image in a completely synthesized state, the parallax is not taken, and the stereoscopic image may not be viewed.

In the central region 333 of the first polarizing unit 330, the light intensity is strong. However, a parallax amount is small. Therefore, if the first polarizing unit 330 according to the third embodiment is adopted, the sufficient base-line length of the binocular parallax can be secured while the intensity of the light received by the imaging element array 409 is increased. As illustrated in FIG. 8A to be a schematic diagram of the first polarizing unit 330, when an external shape of the first polarizing unit 330 is configured as a circular shape, a shape of the central region 333 can be configured as a circular shape and a shape of each of the first region 331 and the second region 332 can be configured as a fan shape that surrounds the central region 333 and has a center angle of 180 degrees. Alternatively, as illustrated in FIGS. 8B and 8C to be schematic diagrams of the first polarizing unit 330, a shape of the central region 333 can be configured as a lozenge shape or a square shape and a shape of each of the first region 331 and the second region 332 can be configured as a shape similar to a fan shape that surrounds the central region 333 and has a center angle of 180 degrees. Alternatively, as illustrated in FIG. 8D to be a schematic diagram of the first polarizing unit 330, a shape of each of the first region, 331, the central region 333, and the second region 332 can be configured as a shape of a band that extends along the second direction.

The configuration of the imaging apparatus according to the third embodiment is the same as the configuration of the imaging apparatus 110 according to the first embodiment, except for the partial configuration described above. Therefore, repeated explanation of the configuration of the imaging apparatus according to the third embodiment is omitted. The configuration of the imaging apparatus according to the third embodiment is applicable to the imaging apparatuses according to the fourth to eleventh embodiments to be described below.

[Fourth Embodiment]

Figure 9:
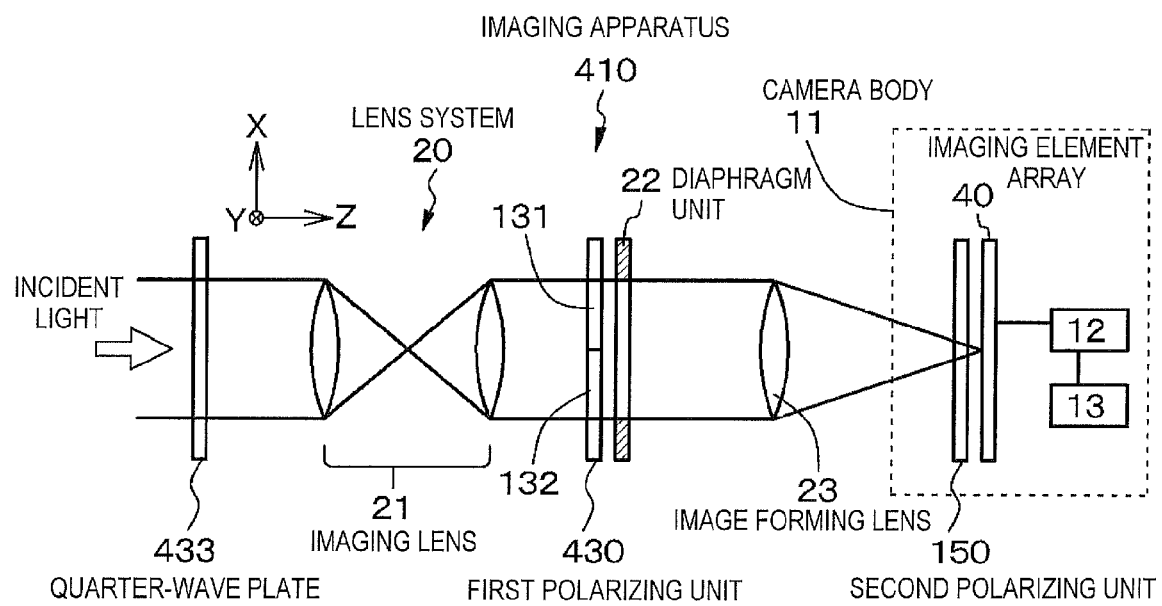
FIG. 9 is a conceptual diagram of an imaging apparatus according to a fourth embodiment.

A fourth embodiment is also a modification of the first embodiment. A conceptual diagram of an imaging apparatus 410 according to the fourth embodiment is illustrated in FIG. 9. In the imaging apparatus 410 according to the fourth embodiment, a quarter-wave plate ($\lambda$/4 wave plate) 433 is arranged on a light incident side of a first polarizing unit 430. Thereby, so-called binocular rivalry can be prevented from being generated. The quarter-wave plate 433 may be mounted to a filter mounting portion provided in a lens system to be removable. A polarization direction of light that has passed through the quarter-wave plate 433 is aligned (linear polarization state). In an image obtained when the light passes through the first region 131 and the third region 151 and arrives at the imaging element array 40 and an image obtained when the light passes through the second region 132 and the fourth region 152 and arrives at the imaging element array 40, the large difference is not generated between images of portions of an object that reflects the P-wave component, but absorbs the S-wave component, and the binocular rivalry can be prevented from being generated. The configuration of the imaging apparatus 410 according to the fourth embodiment is applicable to the imaging apparatuses according to the sixth to eighth embodiments to be described below. A fast axis of the quarter-wave plate 433 preferably forms a predetermined angle (specifically, an angle of 45 degrees or an angle of 45 degrees±10 degrees) with the direction of the electric field of the first region passing light, in the imaging apparatus described in the first embodiment or the second embodiment.

[Fifth Embodiment]

A fifth embodiment is also a modification of the first embodiment. A conceptual diagram of an imaging apparatus 510 according to the fifth embodiment is illustrated in FIG. 10A and schematic diagrams of polarization states of a first polarizing unit and a second polarizing unit are illustrated in FIGS. 10B and 10C, respectively. In the imaging apparatus 510 according to the fifth embodiment, in order to prevent the binocular rivalry from being generated, a polarizing plate 534 that has a polarization axis of $\alpha$ degrees is arranged on a light incident side of a first polarizing unit 530. A first region 531 is configured using a first wave plate, a second region is configured using a second wave plate, and a direction of an electric field of first region passing light $L_1$ is orthogonal to a direction of an electric field of second region passing light $L_2$. Specifically, a value of α is 45 degrees, the first wave plate that forms the first region 531 is configured using a half-wave plate (λ/2 wave plate), and the second wave plate that forms the second region 532 is configured using a half-wave plate (−λ/2 wave plate) that is different from the half-wave plate forming the first wave plate in a phase difference. Thereby, the direction of the electric field of the first region passing light $L_1$ becomes parallel to the first direction and the direction of the electric field of the second region passing light $L_2$ becomes parallel to the second direction. The polarizing plate 534 is fixed on the lens system. Even in the imaging apparatus 510 according to the fifth embodiment, the binocular rivalry can be effectively prevented from being generated. The configuration of the imaging apparatus 510 according to the fifth embodiment is applicable to the imaging apparatuses according to the sixth to eleventh embodiments to be described below.

[Sixth Embodiment]

A sixth embodiment is also a modification of the first embodiment. In the sixth embodiment, a relation between an extinction ratio and parallax has been examined. That is, in order to know an image synthesis ratio at which the parallax becomes disappear, that is, a stereoscopic image is not viewed when laterally separated images are synthesized with each other, a synthesis image simulation is performed while the extinction ratio changes from extinction ratio=∞ (a state in which a crosstalk ratio is 0% and a left eye image and a right eye image are completely separated from each other) to extinction ratio=1 (a state in which a crosstalk ratio is 50%, a left eye image and a right eye image are completely synthesized with each other, and the left eye image and the right eye image are the same image). As a result, the difference between the left eye image and the right eye image decreases as the extinction ratio changes from extinction ratio=∞ to extinction ratio=3 (a crosstalk ratio is 25%) and extinction ratio=10 (a crosstalk ratio is 10%) and the left eye image and the right eye image are the same image at the extinction ratio 1. From the simulation result, it has been determined that the extinction ratio of the polarizer is preferably 3 or more.

[Seventh Embodiment]

A seventh embodiment is also a modification of the first embodiment. In the seventh embodiment, a relation between specifications of a wire grid polarizer and an extinction ratio has been calculated. Specifically, a relation between a pitch of wires forming the wire grid polarizer, a wavelength (λ) of incident light, and an extinction ratio is illustrated in FIG. 11A. The width of the wires is set to ⅓ of the pitch of the wires, the height of the wires is set to 150 nm, and the length of the wires is set to ∞. In FIG. 11A, a curved line "A" shows data in the case in which the pitch is 150 nm, a curved line "B" shows data in the case in which the pitch is 175 nm, a curved line "C" shows data in the case in which the pitch is 200 nm, a curved line "D" shows data in the case in which the pitch is 250 nm, and a curved line "E" shows data in the case in which the pitch is 300 nm. A relation between the height of wires forming the wire grid polarizer, a wavelength (λ) of incident light, and an extinction ratio is illustrated in FIG. 11B. The width of the wires is set to 50 nm, the length of the wires is set to ∞, and a pitch of the wires is set to 150 nm. In FIG. 11B, a curved line "A" shows data in the case in which the height is 250 nm, a curved line "B" shows data in the case in which the height is 200 nm, a curved line "C" shows data in the case in which the height is 150 nm, and a curved line "D" shows data in the case in which the height is 100 nm. A relation between (width/pitch) of wires forming the wire grid polarizer, a wavelength (λ) of incident light, and an extinction ratio is illustrated in FIG. 11C. The width of the wires is set to 50 nm, the height of the wires is set to 150 nm, and the length of the wires is set to ∞. In FIG. 11C, a curved line "A" shows data in the case in which a value of (width/pitch) is 0.50 and a curved line "B" shows data in the case in which a value of (width/pitch) is 0.33.

From FIG. 11A, it has been determined that the pitch of the wires is preferably 200 nm or less, the height of the wires is preferably $5 \times 10^{-8}$ m (50 nm) or more, and the value of (width/pitch) of the wires is preferably 0.33 or more, in order to maintain the extinction ratio at 10 or more. The number of wires is preferably 10 or more.

Figure 12:
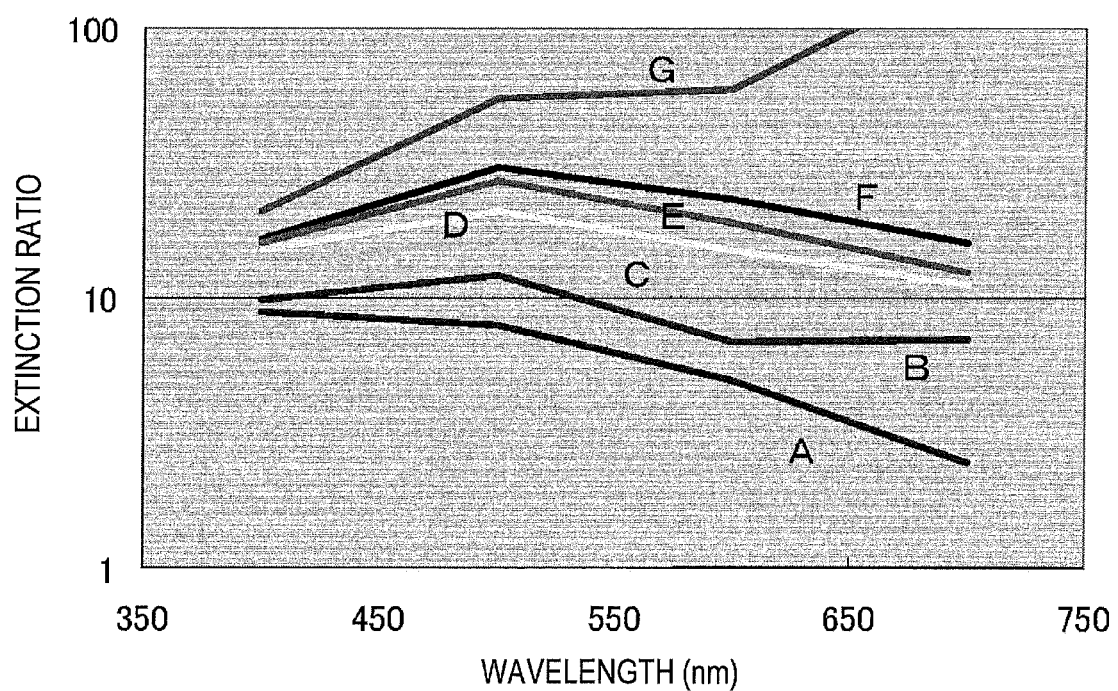
FIG. 12 is a graph illustrating a calculation result of a relation between lengths of two wires forming the wire grid polarizer, a wavelength of incident light, and an extinction ratio, in the seventh embodiment.

A relation between lengths of two wires, a wavelength (λ) of incident light, and an extinction ratio is illustrated in FIG. 12. The width of the wires is set to 50 nm, the height of the wires is set to 150 nm, and the pitch of the wires is set to be three times larger than the width of the wires. In FIG. 12, a curved line "A" shows data in the case in which the length is 1 μm, a curved line "B" shows data in the case in which the length is 2 μm, a curved line "C" shows data in the case in which the length is 3 μm a curved line "D" shows data in the case in which the length is 4 μm, a curved line "E" shows data in the case in which the length is 5 μm, a curved line "F" shows data in the case in which the length is 6 μm and a curved line "G" shows data in the case in which the length is ∞. From FIG. 12, it has been determined that the length of the wires is set to 2 μm or more, preferably, 3 μm or more, in order to maintain the extinction ratio at 10 or more. In addition, it has been determined that a material forming the wires is preferably aluminum or an aluminum alloy, from a viewpoint of easy machining.

[Eighth Embodiment]

Figure 13:
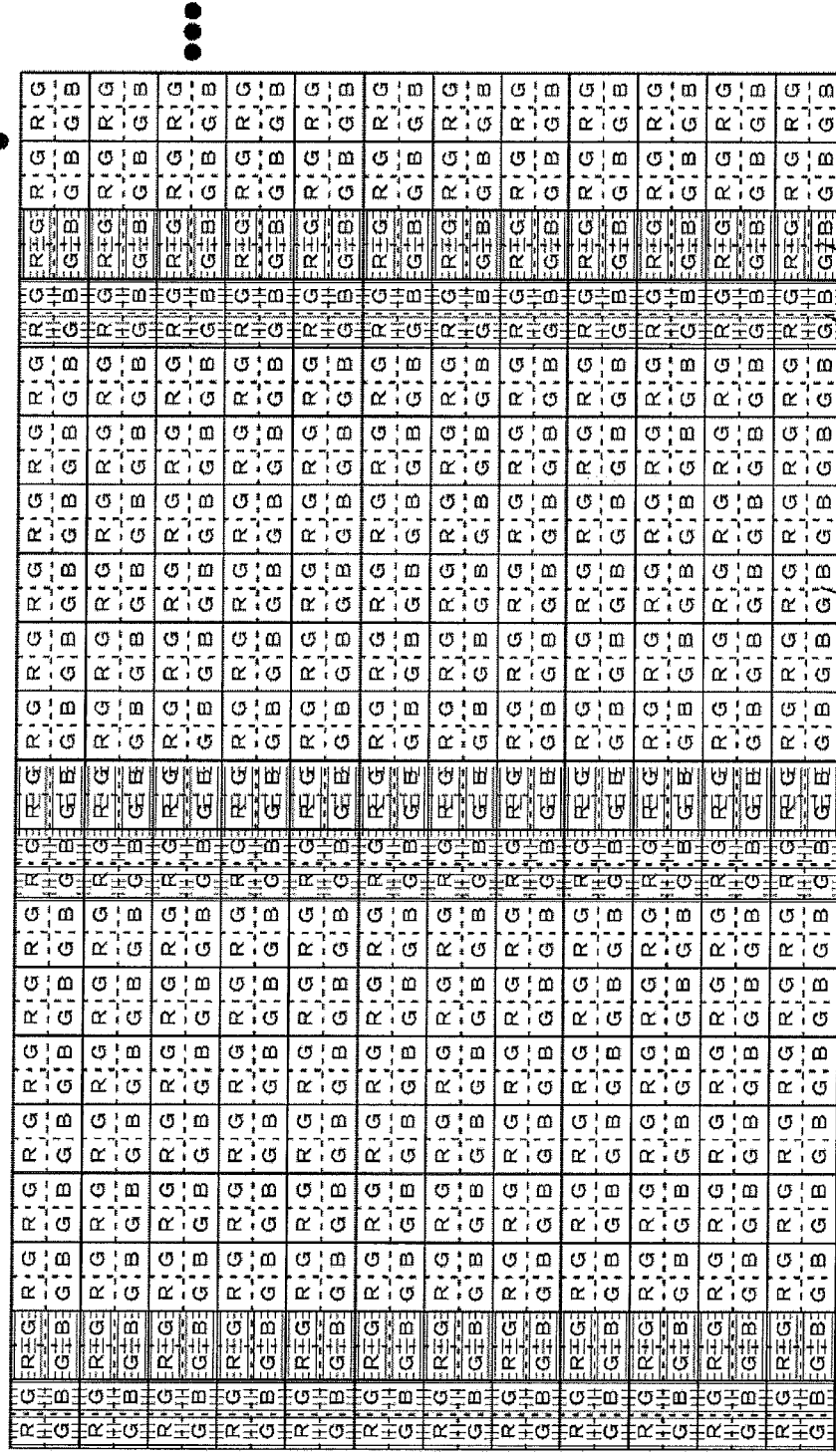
FIG. 13 is a conceptual diagram of an imaging element array having a Bayer arrangement in an imaging apparatus according to an eighth embodiment.

An eighth embodiment is also a modification of the first embodiment. As illustrated in FIG. 13 to be a conceptual diagram of an imaging element array having a Bayer arrangement, in an imaging apparatus according to the eighth embodiment, one third region 151 and one fourth region 152 are arranged with respect to N pixels (N is $2^n$ and n is a natural number of 1 to 5, specifically, n=3 in the eighth embodiment) along a first direction. An electric signal to obtain a right eye image and an electric signal to obtain a left eye image are obtained on the basis of a depth map (depth information) based on a parallax amount generated from an electric signal obtained by first region passing light passed through the third region 151 and an electric signal obtained by second region passing light passed through the fourth region 152 and electric signals from all of imaging elements 41 forming an imaging element array 40. In this case, however, a well-known method may be used. In addition, demosaicking processing may be executed on the basis of all of electric signals, including all of imaging elements in which the third region and the fourth region are arranged and all of imaging elements in which the third region and the fourth region are not arranged, and a portion where a column of an imaging element group in which the third region and the fourth region are arranged has been thinned out may be interpolated by super-resolution processing and image data may be generated. An image quality/pixel number of the depth map with respect to an image quality/pixel number of an image may not be 1:1. This reason is as follows. In most of photographing scenes, each object is sufficiently large as compared with pixel resolution, and distance information resolution that is equal to the pixel resolution of the image is not necessary, as long as there is no distance difference having the same fineness as the pixel resolution in each object.

Figure 14:
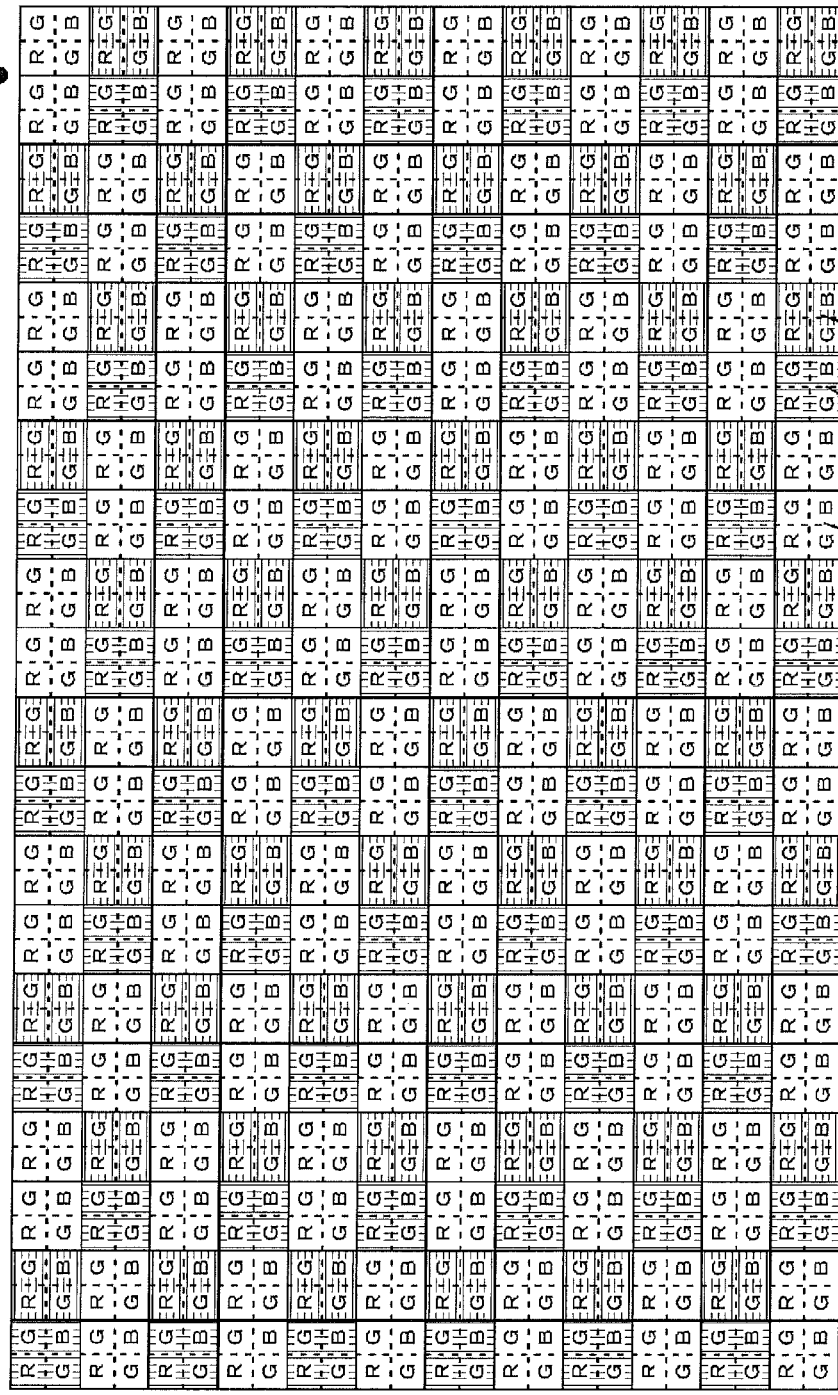
FIG. 14 is a conceptual diagram of an imaging element array having a Bayer arrangement in a first modification of the imaging apparatus according to the eighth embodiment.

A conceptual diagram of an imaging element array having a Bayer arrangement in a modification of the imaging apparatus according to the eighth embodiment is illustrated in FIG. 14. In this case, one third region 151 and one fourth region 152 can be arranged with respect to two pixels along the second direction. In an example illustrated in FIG. 14, the third region 151 and the fourth region 152 are arranged in a zigzag shape (checkered shape). That is, the third region 151 is adjacent to the fourth region 152 at one boundary of the third region 151, along the first direction. However, the third region 151 is not adjacent to the fourth region 152 at the other boundary of the third region 151.

[Ninth Embodiment]

A ninth embodiment is a modification of the imaging apparatuses according to the first to third embodiments and the fifth to eighth embodiments. A conceptual diagram of an imaging apparatus according to the ninth embodiment is illustrated in FIG. 15A, a conceptual diagram of a quarter-wave plate is illustrated in FIG. 15B, a schematic diagram of a polarization state of a first polarizing unit is illustrated in FIG. 15C, and a schematic diagram of a polarization state of a polarizing unit (second polarizing unit) is illustrated in FIG. 15D.

In an imaging apparatus 910 according to the ninth embodiment, a quarter-wave plate 933 is provided on a light incident side of a first polarizing unit 930. A fast axis (shown by a black arrow in FIGS. 15B, 16A, 16D, and 16E) of the quarter-wave plate 933 forms a predetermined angle with a direction of an electric field of first region passing light $L_1$. The direction of the electric field of the first region passing light $L_1$ is parallel to a direction of an electric field of third region passing light $L_3$ and a direction of an electric field of second region passing light $L_2$ is parallel to a direction of an electric field of fourth region passing light $L_4$. In this case, the predetermined angle is 45 degrees or 45 degrees±10 degrees. This is applicable to the following description. The direction of the electric field of the third region passing light is orthogonal to the direction of the electric field of the fourth region passing light. The direction of the electric field of the third region passing light is parallel to the first direction (refer to FIG. 15D) or the direction of the electric field of the third region passing light forms an angle of 45 degrees with the first direction (refer to FIG. 16C). The quarter-wave plate 933 has a configuration similar to a diaphragm blade of a lens and is arranged in a lens system 20.

Figure 16:
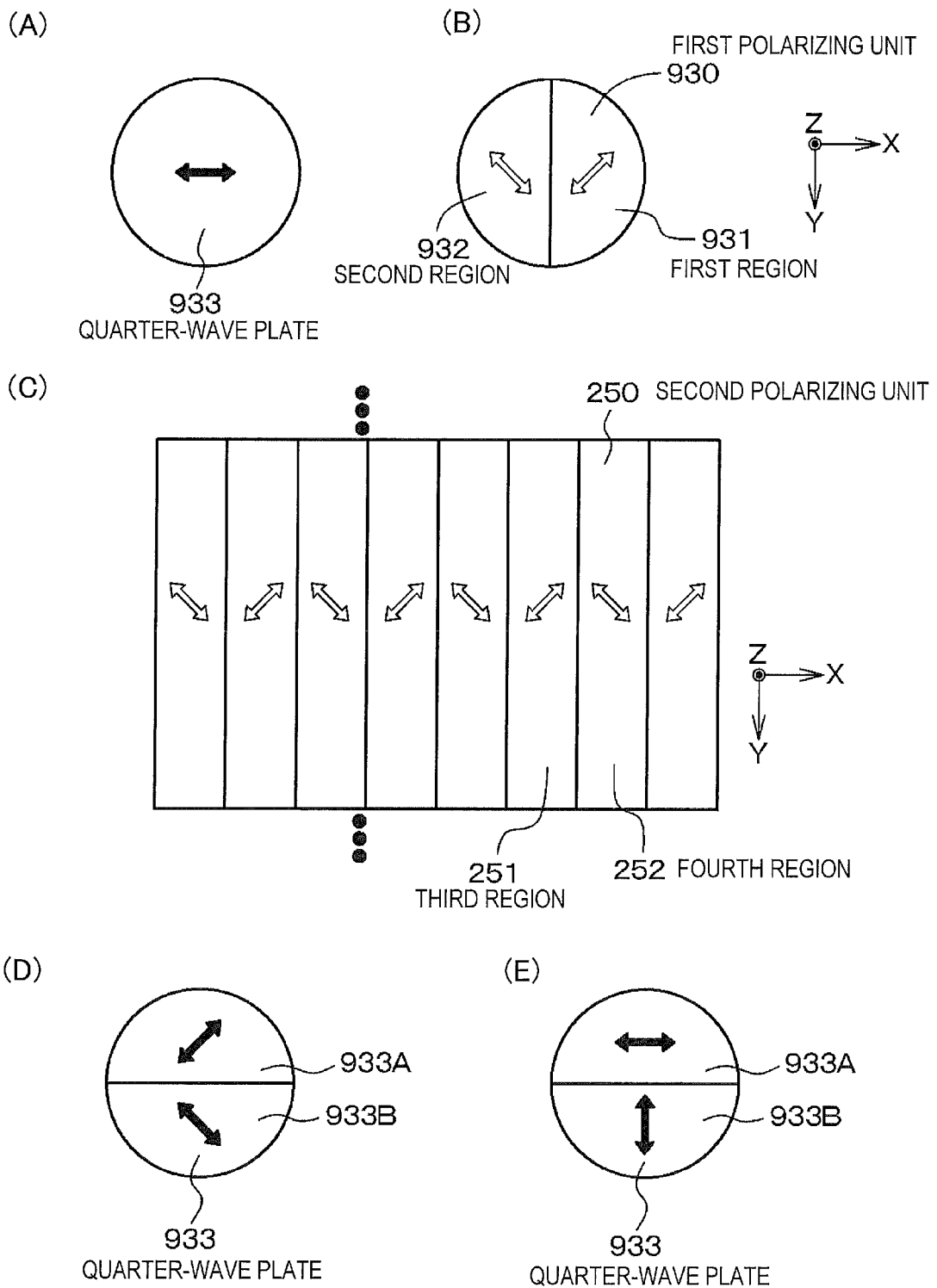
FIGS. 16A to 16C are a conceptual diagram of the quarter-wave plate in the imaging apparatus according to the ninth embodiment, a schematic diagram illustrating a polarization state of the first polarizing unit, and a schematic diagram illustrating a polarization state of the polarizing unit (second polarizing unit), respectively.
FIGS. 16D and 16E are conceptual diagrams of a quarter-wave plate in the imaging apparatus according to the tenth embodiment.

The first polarizing unit 930 is mounted to the lens system 20 to be removable and the quarter-wave plate 933 is also mounted to the lens system 20 to be removable. The quarter-wave plate 933 is arranged to be adjacent to the first polarizing unit 930. In FIG. 15A, the quarter-wave plate 933 and the first polarizing unit 930 are illustrated sequentially from the light incident side. However, the first polarizing unit 930 and the quarter-wave plate 933 may be arranged sequentially from the light incident side, in some cases. The quarter-wave plate 933 and the first polarizing unit 930 may be arranged sequentially from the light incident side and the quarter-wave plate 933 and the first polarizing unit 930 may be arranged in the lens system, so that a three-dimensional image (stereoscopic image) can be imaged. Alternatively, the first polarizing unit 930 may be arranged in the lens system and the quarter-wave plate 933 may be removed from the lens system, so that a three-dimensional image (stereoscopic image) can be imaged. The quarter-wave plate 933 may be arranged in the lens system and the first polarizing unit 930 may be removed from the lens system, so that a two-dimensional image can be imaged. Meanwhile, the first polarizing unit 930 and the quarter-wave plate 933 may be arranged sequentially from the light incident side, the first polarizing unit 930 may be arranged in the lens system, and the quarter-wave plate 933 may be removed from the lens system, so that a three-dimensional image (stereoscopic image) can be imaged. The quarter-wave plate 933 may be arranged in the lens system and the first polarizing unit 930 may be removed from the lens system, so that a two-dimensional image can be imaged. In FIG. 15B, an extension direction of a fast axis of the quarter-wave plate 933 that is shown by a black arrow extending in an upper right 45 degree direction is not limited to the upper right 45 degree direction and the fast axis may extend in an upper left 45 degree direction. A conceptual diagram of the quarter-wave plate in the imaging apparatus according to the ninth embodiment, a modification of a polarization state of the first polarizing unit, and a modification of a polarization state of the polarizing unit (second polarizing unit) are illustrated in FIGS. 16A, 16B, and 16C, respectively. This example is a modification of the second embodiment illustrated in FIG. 6.

When the first polarizing unit 930 is removed from the lens system 20 and a user attempts to image a normal two-dimensional image, if light incident on the imaging apparatus includes linearly polarized light, the difference may be generated between the intensity of the light passed through the third regions 151 and 152 and the intensity of the light passed through the fourth regions 152 and 252 and shading of stripe-shaped light may be generated in an obtained two-dimensional image. In the imaging apparatus according to the ninth embodiment, because the quarter-wave plate 933 of which a fast axis forms a predetermined angle (specifically, 45 degrees or 45 degrees±10 degrees) with the direction of the electric field of the third region passing light is assembled, linearly polarized light that is incident on the quarter-wave plate 933 becomes light in a circular polarization state and is emitted from the quarter-wave plate 933. Therefore, the difference is rarely generated between the intensity of the light passed through the third regions 151 and 152 and the intensity of the light passed through the fourth regions 152 and 252 and shading of stripe-shaped light is not generated in an obtained two-dimensional image.

[Tenth Embodiment]

A tenth embodiment is a modification of the ninth embodiment. As illustrated in FIG. 16D or 16E to be a conceptual diagram of a quarter-wave plate in an imaging apparatus according to the tenth embodiment, in the tenth embodiment, a quarter-wave plate 933 includes a first quarter-wave plate 933A and a second quarter-wave plate 933B that are arranged along a second direction. The first quarter-wave plate 933A and the second quarter-wave plate 933B are integrated with each other. A fast axis of the first quarter-wave plate 933A forms a predetermined angle with a direction of an electric field of first region passing light and a fast axis of the second quarter-wave plate 933B is orthogonal to the fast axis of the first quarter-wave plate 933A. In other words, the fast axis of the second quarter-wave plate 933B is parallel to a slow axis of the first quarter-wave plate 933A. In this case, the predetermined angle is 45 degrees or 45 degrees±10 degrees. An example illustrated in FIG. 16D is a modification of the example illustrated in FIG. 15B and an example illustrated in FIG. 16E is a modification of the example illustrated in FIG. 16B. The configuration of the imaging apparatus according to the tenth embodiment is the same as the configuration of the imaging apparatus according to the ninth embodiment, except for the partial configuration described above. Therefore, repeated explanation of the configuration of the imaging apparatus is omitted. By configuring the quarter-wave plate 933 using the first quarter-wave plate 933A and the second quarter-wave plate 933B, the difference is rarely generated between the intensity of the light passed through the third regions 151 and 152 and the intensity of the light passed through the fourth regions 152 and 252. In the examples illustrated in FIGS. 16D and 16E, the quarter-wave plate includes the first quarter-wave plate and the second quarter-wave plate that are arranged along the second direction. However, the quarter-wave plate may include the first quarter-wave plate and the second quarter-wave plate that are arranged along the first direction, instead of the second direction.

[Eleventh Embodiment]

An eleventh embodiment relates to an imaging apparatus and an imaging method according to a second aspect of the present disclosure and more particularly, to an imaging apparatus and an imaging method to image an object as a stereoscopic image. A conceptual diagram of the imaging apparatus according to the eleventh embodiment is illustrated in FIG. 17A and schematic diagrams of polarization states of a first polarizing unit and a second polarizing unit are illustrated in FIGS. 17B and 17C, respectively.

An imaging apparatus 1110 according to the eleventh embodiment includes (A) a first polarizing unit 1130 that polarizes light from an object, (B) a lens system 20 that condenses light from the first polarizing unit 1130, and (C) an imaging element array 40 that has imaging elements 41 arranged in a matrix of a first direction (horizontal direction and X-axis direction) and a second direction (vertical direction and Y-axis direction) orthogonal to the first direction, a second polarizing unit 1150 arranged on a light incident side, and converts the light condensed by the lens system 20 into an electric signal.

The first polarizing unit 1130 has a first region 1131 and a second region 1132 arranged along the first direction (horizontal direction and X-axis direction).

A polarization state of first region passing light $L_1$ that is passed through the first region 1131 is different from a polarization state of second region passing light $L_2$ that is passed through the second region 1132.

The second polarizing unit 1150 has a plurality of third regions 1151 and a plurality of fourth regions 1152 that are arranged alternately along the first direction (horizontal direction and X-axis direction) and extend in the second direction (vertical direction and Y-axis direction).

Third region passing light $L_3$ that is passed through the third region 1151 is in a polarization state and fourth region passing light $L_4$ that is passed through the fourth region 1152 is in a non-polarization state (that is, a state in which the first region passing light $L_1$ and the second region passing light $L_2$ are synthesized).

The first region passing light $L_1$ passes through the third region 1151 and arrives at the imaging element 41 and the first region passing light $L_1$ and the second region passing light $L_2$ pass through the third region 1152 and arrive at the imaging element 41, thereby imaging an image to obtain a stereoscopic image in which a distance between a center of gravity point $BC_1'$ of the first region 1131 and a center of gravity point $BC_0'$ of the first polarization unit 1130 is set as a base-line length of binocular parallax.

Even in the imaging apparatus 1110 according to the eleventh embodiment, the first polarizing unit 1130 includes the first region 1131 and the second region 1132. Specifically, an external shape of the first polarizing unit 130 is a circular shape and each of the first region 1131 and the second region 1132 has an external shape of a half-moon that occupies half of the first polarizing unit 130. A boundary line of the first region 1131 and the second region 1132 extends along the second direction. The first polarizing unit 1130 that is formed by combining the two polarization filters separates a polarization state of incident light into two different polarization states. As described above, the first polarizing unit 1130 is configured using the bilaterally symmetric polarizers and generates polarizations of linear directions to be orthogonal to each other or polarizations of rotation directions to be reversed to each other at left and right two positions with respect to an elected state of a camera. The first region 1131 is a filter that performs polarization with respect to an image of the object to be viewed by a right eye (light to be received by the right eye). The first region 1131 and the second region 1132 are filters that perform polarization with respect to an image of the object to be viewed by a left eye (light to be received by the left eye). The first polarizing unit 1130 can have substantially the same configuration as the configuration of the first polarizing unit 130 described in the first embodiment.

The third region 1151 has substantially has the same configuration as the configuration described in the first embodiment, the third region passing light $L_3$ that is passed through the third region 1151 is in a polarization state, and a direction of an electric field of the first region passing light $L_1$ is parallel to a direction (shown by a void arrow) of an electric field of the third region passing light $L_3$. An extinction ratio of a polarizer is 3 or more, specifically, 10 or more. The third region 1151 is configured using a wire grid polarizer and an extension direction of wires is parallel to a second direction. Therefore, a maximum value of the length of the wires that form the wire grid polarizer is the length of pixels arranged in the second direction. A relation between the length of the wire grid polarizer and the extinction ratio is as described in the seventh embodiment. In the eleventh embodiment, because the length of the wires forming the wire grid polarizer can be sufficiently increased, a value of the extinction ratio can be increased and high resolution of a left eye image and a right eye image can be achieved. Meanwhile, a polarizer is not arranged in the fourth region 1152.

In the imaging apparatus 1110 according to the eleventh embodiment, an external shape of the first polarizing unit 1130 is configured as a circular shape that has a radius r=10 mm. Each of the first region 1131 and the second region 1132 is formed to have a shape of a half-moon that occupies half of the first polarizing unit 1130. Therefore, a distance between a center of gravity point $BC_1'$ of the first region 1131 and a center of gravity point $BC_0'$ of the first polarizing unit 1130 is $[(4r)/(3\pi)]=4.2$ mm.

In the imaging method according to the eleventh embodiment, an electric signal (first electric signal) to obtain one image (specifically, the right eye image, that is, the right eye image data in the eleventh embodiment) of the left eye image and the right eye image is generated in the imaging element 41, by the first region passing light $L_1$ that passes through the third region 1151 and arrives at the imaging element 41. In addition, an electric signal (second electric signal) to obtain the other image (specifically, the left eye image, that is, the left eye image data in the eleventh embodiment) of the left eye image and the right eye image is generated in the imaging element 41, by the first region passing light $L_1$ and the first region passing light $L_2$ that pass through the fourth region 1152 and arrive at the imaging element 41. The electric signals (first and second electric signals) are output simultaneously or alternately in time series. The image processing unit 12 executes image processing with respect to the output electric signals (electric signals to obtain the right eye image data and the left eye image data, which are output from the imaging element array 40) and the electric signals are recorded as the obtain right eye image data and left eye image data in the image storage unit 13. If the right eye image data and the left eye image data are synthesized, instead of a stereoscopic image, a normal two-dimensional (plane) image can be obtained.

The imaging element array 40 may have the same Bayer arrangement as the Bayer arrangement described in each embodiment and generation of the right eye image data and the left eye image data in the image processing unit 12 may be performed using the same method as the method described in the first embodiment. The configurations that are described in the second to tenth embodiments are applicable to the eleventh embodiment.

Even in the eleventh embodiment, because the imaging apparatus 1110 can be configured using one set of the first polarizing unit 1130 and the second polarizing unit 1150 and one lens system 20, two different images that are laterally separated can be generated at the same time and a small imaging apparatus that has a monocular simple configuration and has a small number of structural elements can be provided. Because two sets of combinations of lenses and polarization filters are not necessary, a deviation or a difference does not occur in zooming, a diaphragm unit, focusing, and a convergence angle. Because the base-line length of the binocular parallax is relatively short, a natural stereoscopic effect can be obtained. If the first polarizing unit 1130 is configured to be removable, a two-dimensional image and a three-dimensional image can be easily obtained.

[Twelfth Embodiment]

A twelfth embodiment or a thirteenth embodiment to be described below relates to a lens system. In the twelfth embodiment or the thirteenth embodiment, as illustrated in FIGS. 18A and 18B to be schematic partial cross-sectional views, the lens systems include single focus lenses 80 and 90 and diaphragm units 86 and 96 arranged on front surfaces or front sides (object sides) of the single focus lenses 80 and 90, respectively. The diaphragm units 86 and 96 are arranged on the front surfaces (object sides) of the single focus lenses 80 and 90, respectively. That is, the diaphragm units 86 and 96 are configured using front-diaphragm single focus lenses. The first polarizing units 130 are arranged in the vicinity of the diaphragm units 86 and 96 of the lens systems. The first polarizing units 130 are mounted to the lens systems to be removable. Each of the single focus lenses 80 and 90 may be moved in a forward-to-backward direction with respect to an imaging element array 40 as a whole, that is, includes a mechanism for drawing an entire group and shows an automatic focus function by the mechanism. The shortest distance $D_{min}$ between the first polarizing units 130 arranged closer to the object than the diaphragm units 86 and 96 and the single focus lenses 80 and 90 is 0.6 mm or less, specifically, from 0.05 to 0.6 mm.

In the twelfth embodiment or the thirteenth embodiment to be described below, the imaging element array 40 that has the second polarizing unit 150 (not illustrated in FIGS. 18A and 18B) is mounted to a base 70. A member in which the first polarizing unit 130 and an opening are provided (only the first polarizing unit 130 is illustrated in FIGS. 18A and 18B) is mounted to a rotation/support member 71 and the rotation/support member 71 is mounted to the base 70. The member in which the first polarizing unit and the opening are provided is mounted to a rotation shaft (although the rotation shaft is included in the rotation/support member 71, the rotation shaft is not illustrated in the drawings) parallel to an optical axis of the lens system to be rotatable about the rotation shaft and the member is rotated about the rotation shaft, so that a ray passing through the lens system passes through the opening or the first polarizing unit 130. By this configuration, the first polarizing unit 130 is mounted to the lens system to be removable. Alternatively, the member in which the first polarizing unit 130 and the opening are provided is mounted to the lens system to be slidable in a direction orthogonal to the optical axis of the lens system and the member is slid, so that a ray passing through the lens system passes through the opening or the first polarizing unit. In this case, the member in which the first polarizing unit 130 and the opening are provided may be configured using one member or a plurality of member pieces.

In the twelfth embodiment, a CMOS image sensor that has a 1/3.2 size and has 13 megapixels arranged at a pitch of 1.12 μm is used. A two-dimensional image and a three-dimensional image can be easily obtained by mounting or removing the first polarizing unit 130.

In the twelfth embodiment, the single focus lens 80 has a configuration of four groups and four lenses in which $F_{no}=2.8$, focal distance=4.21 mm, horizontal angle of view=56 degrees, and entire optical length=5.0 mm are set. In this case, the single focus lens 80 is configured using an imaging lens group consisting of a first lens 81, a second lens 82, a third lens 83, and a fourth lens 84 provided sequentially from an object side and takes a triplet configuration of positive power/negative power/positive power by the first lens 81, the second lens 82, and the third lens 83. The fourth lens 84 that optimizes an incidence angle of a ray incident on an image surface and the imaging element array 40 is added and the single focus lens 80 has an optimal function as a small high-resolution lens. In an MTF, the contrast is about 50% at the image height of 220 (lps/mm) In order to realize the high-resolution lens, eccentricity accuracy of a lens group should be suppressed at about 3 μm. Therefore, in a lens barrel 74 in which the accuracy is suppressed at about 1 μm, a lens group should be assembled with high accuracy. For this reason, as an automatic focus method, an entire group drawing method is preferable more than a method of drawing a portion of an imaging lens group. Therefore, in the twelfth embodiment or the thirteenth embodiment, an automatic focus mechanism using a driving type of a voice coil type is adopted. Specifically, a focus coil 76 is wound around the lens barrels of the single focus lenses 80 and 90, a magnet 75 is disposed around the focus coil 76, and a current is made to flow through the focus coil 76, so that the single focus lenses 80 and 90 can move in a forward-to-backward direction with respect to the imaging element array 40 as a whole. The lens barrel 74 is mounted to a support member 72 through a plate spring 73 and the support member 72 is mounted to the base 70.

If the shortest distance $D_{min}$ between a lens surface of the first lens 81 at the object side and the first polarizing unit 130 is long, a light amount in the vicinity of the imaging element array 40 decreases. For this reason, the shortest distance $D_{min}$ is preferably 0.6 mm or less, as described above. In the twelfth embodiment, the shortest distance $D_{min}$ is set to 0.50 mm. In order to realize the shortest distance $D_{min}$, a surrounding portion of a light ray effective diameter of a mechanism for mounting or removing the first polarizing unit 130, specifically, the member (not illustrated in the drawings) in which the first polarizing unit 130 and the opening are provided at the side of the single focus lenses 80 and 90 are preferably notched. In addition, the rotation/support member 71, the lens barrel 74, and the support member 72 are preferably designed such that the mechanism for mounting or removing the first polarizing unit 130 and the single focus lenses 80 and 90 do not contact, that is, the first polarizing unit 130 or a bottom surface of the member in which the first polarizing unit 130 and the opening are provided and a frontmost surface of the lens barrel 74 do not contact when a bottom surface of a portion of the rotation/support member 71 supporting the first polarizing unit 130 and a top surface of a portion of the lens barrel 74 facing the bottom surface contact, specifically, $D_0 > D_1$ is satisfied as illustrated in the drawings.

As such, in the twelfth embodiment or the thirteenth embodiment to be described below, the lens system is a high-resolution lens that has high eccentricity accuracy. The lens system has an automatic focus mechanism of entire group drawing and the first polarizing unit is mounted to the lens system to be removable. The first polarizing unit and the lens system can be easily assembled, and because the lens group can be sealed, dusts can be prevented from being infiltrated. A small stereoscopic camera system can be easily realized, an automatic focus mechanism can be easily achieved, and high macroperformance can be obtained at a low cost. Because a pupil is positioned at the front side in the front-diaphragm single focus lens, an incidence angle of a principal ray with respect to the imaging element array can be suppressed. Because the distance between the first polarizing unit and the imaging element array is long, flare that is generated by slight reflection light from both the first polarizing unit and the imaging element array is small. Loss does not occur in a light amount when a two-dimensional image is obtained.

[Thirteenth Embodiment]

In the thirteenth embodiment, the single focus lens 90 corresponds to an imaging element array that has a 1/3.2 size and has a pitch of 1.12 μm. The single focus lens 90 has a configuration of five groups and five lenses in which $F_{no}=1.7$, focal distance=4.49 mm, horizontal angle of view=53.8 degrees, and entire optical length=5.7 mm are set. Because $F_{no}$ is bright, a pupil diameter is large. Because the base-line length of the binocular parallel is long, a superior stereoscopic image can be obtained. In this case, the single focus lens 90 includes a first lens 91, a second lens 92, a third lens 93, a fourth lens 94, and a fifth lens 95 provided sequentially from an object side. The single focus lens 90 takes a triplet configuration of positive power/negative power/positive power by the first lens 91, the second lens 92, and the third lens 93, the fourth lens 94 and the fifth lens 95 have positive power and negative power, and various aberrations can be corrected with high accuracy while optical distortion is corrected. The fifth lens 95 also has a function of optimizing an incidence angle of a ray incident on the image surface and the imaging element array 40. Thereby, a small high-resolution lens can be achieved.

The lens system according to the twelfth embodiment or the thirteenth embodiment described above is applicable to the first to eleventh embodiments.

The present disclosure has been described in conjunction with the preferred embodiments. However, the present disclosure is not limited to the embodiments. The configurations of the imaging apparatus and the imaging element described in the embodiments are only exemplary and can be appropriately changed. For example, as illustrated in FIG. 19A to be a schematic partial cross-sectional view, the imaging element 41 can be formed by stacking a first flattening film 62, an inorganic insulating base layer 66, a wire grid polarizer 67, a second flattening film 65, a color filter 63, and an on-chip lens 64 on a photoelectric conversion element 61 provided in a silicon semiconductor substrate 60. Alternatively, as illustrated in FIG. 19B to be a schematic partial cross-sectional view, the imaging element 41 can be formed by stacking a first flattening film 62, an on-chip lens 64, a second flattening film 65, a color filter 63, an inorganic insulating base layer 66, and a wire grid polarizer 67 on a photoelectric conversion element 61 provided in a silicon semiconductor substrate 60. The imaging element may be a surface irradiation type illustrated in the drawings and may be a back surface irradiation type not illustrated in the drawings.

A stereoscopic image is displayed on the basis of the right eye image data and the left eye image data. As a display method, a method of mounting a circular polarization filter and a linear polarization filter to two projectors, displaying a left eye image and a right eye image, and observing the images with circular polarization and linear polarization glasses corresponding to the display, a lenticular lens method, and a parallax barrier method may be used. If the image is observed without using the circular polarization glass or the linear polarization glass, a normal two-dimensional (plane) image can be observed. The processing sequences described above may be understood as a method having a series of sequences and may be understood as a program for executing a computer to execute the series of sequences or recording media storing the program. As the recording media, a compact disc (CD), a minidisc (MD), a digital versatile disk (DVD), a memory card, and a Blue-ray disc (registered trademark) may be used.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) An imaging apparatus including:

a first polarizing unit that polarizes light from an object;

a lens system that condenses light from the first polarizing unit; and an imaging element array that has imaging elements arranged in a matrix of a first direction and a second direction orthogonal to the first direction, has a second polarizing unit arranged on a light incident side, and converts the light condensed by the lens system into an electric signal, wherein the first polarizing unit has a first region and a second region that are arranged along the first direction, a polarization state of first region passing light that has passed through the first region is different from a polarization state of second region passing light that has passed through the second region, the second polarizing unit has a plurality of third regions and a plurality of fourth regions that are arranged alternately along the first direction and extend in the second direction, a polarization state of third region passing light that has passed through the third region is different from a polarization state of fourth region passing light that has passed through the fourth region, and the first region passing light passes through the third region and arrives at the imaging element and the second region passing light passes through the fourth region and arrives at the imaging element, thereby imaging an image to obtain a stereoscopic image in which a distance between a center of gravity point of the first region and a center of gravity point of the second region is set as a base-line length of binocular parallax.

(2) The imaging apparatus according to (1),
wherein the first polarizing unit is arranged in the vicinity of a diaphragm unit of the lens system.

(3) The imaging apparatus according to (1) or (2),
wherein a central region is provided between the first region and the second region, in the first polarizing unit, and
a polarization state of central region passing light that has passed through the central region does not change from a polarization state of light before being incident on the central region.

(4) The imaging apparatus according to any one of (1) to (3),
wherein each of the first region and the second region is configured using a polarizer, and
a direction of an electric field of the first region passing light is orthogonal to a direction of an electric field of the second region passing light.

(5) The imaging apparatus according to (4),
wherein the direction of the electric field of the first region passing light is parallel to the first direction.

(6) The imaging apparatus according to (4),
wherein the direction of the electric field of the first region passing light forms an angle of 45 degrees with the first direction.

(7) The imaging apparatus according to any one of (4) to (6),
wherein the direction of the electric field of the first region passing light is parallel to a direction of an electric field of the third region passing light, and
the direction of the electric field of the second region passing light is parallel to a direction of an electric field of the fourth region passing light.

(8) The imaging apparatus according to any one of (4) to (7),
wherein an extinction ratio of the polarizer is 3 or more.

(9) The imaging apparatus according to any one of (4) to (8),
wherein the imaging element is formed by stacking a color filter, an on-chip lens, and a wire grid polarizer, and
the wire grid polarizer forms the third region or the fourth region.

(10) The imaging apparatus according to any one of (4) to (8),
wherein the imaging element is formed by stacking a wire grid polarizer, a color filter, and an on-chip lens, and the wire grid polarizer forms the third region or the fourth region.

(11) The imaging apparatus according to (9) or (10),
wherein an extension direction of a plurality of wires forming the wire grid polarizer is parallel to the first direction or the second direction.

(12) The imaging apparatus according to any one of (1) to (11),
wherein a quarter-wave plate is arranged on a light incident side of the first polarizing unit.

(13) The imaging apparatus according to (5) or (6),
wherein a quarter-wave plate is arranged on a light incident side of the first polarizing unit, and
a fast axis of the quarter-wave plate forms a predetermined angle with the direction of the electric field of the first region passing light.

(14) The imaging apparatus according to (5) or (6),
wherein a quarter-wave plate includes a first quarter-wave plate and a second quarter-wave plate that are arranged along the first direction or the second direction,
a fast axis of the first quarter-wave plate forms a predetermined angle with the direction of the electric field of the first region passing light, and a fast axis of the second quarter-wave plate is orthogonal to the fast axis of the first quarter-wave plate.

(15) The imaging apparatus according to (13) or (14),
wherein the predetermined angle is 45 degrees.

(16) The imaging apparatus according to any one of (13) to (15),
wherein the direction of the electric field of the first region passing light is parallel to a direction of an electric field of the third region passing light, and
the direction of the electric field of the second region passing light is parallel to a direction of an electric field of the fourth region passing light.

(17) The imaging apparatus according to any one of (13) to (16),
wherein the first polarizing unit is mounted to the lens system to be removable, and
the quarter-wave plate is mounted to the lens system to be removable.

(18) The imaging apparatus according to any one of (13) to (17),
wherein the quarter-wave plate is arranged to be adjacent to the first polarizing unit.

(19) The imaging apparatus according to any one of (1) to (3),
wherein a polarizing plate that has a polarization axis of $\alpha$ degrees is arranged on a light incident side of the first polarizing unit,
the first region is configured using a first wave plate and the second region is configured using a second wave plate, and
a direction of an electric field of the first region passing light is orthogonal to a direction of an electric field of the second region passing light.

(20) The imaging apparatus according to (19),
wherein a value of $\alpha$ is 45 degrees,
the first wave plate is composed of a half-wave plate, and
the second wave plate is composed of a half-wave plate that is different from the half-wave plate forming the first wave plate in a phase difference.

(21) The imaging apparatus according to any one of (1) to (20),
wherein the imaging element array has a Bayer arrangement and one pixel includes four imaging elements, and
one third region or one fourth region is arranged with respect to one pixel.

(22) The imaging apparatus according to any one of (1) to (21),
wherein one third region and one fourth region are arranged with respect to N pixels (N represents $2^n$ and n represents a natural number of 1 to 5) along the first direction.

(23) An imaging method using an imaging apparatus, the imaging apparatus including a first polarizing unit that polarizes light from an object, a lens system that condenses light from the first polarizing unit, and an imaging element array that has imaging elements arranged in a matrix of a first direction and a second direction orthogonal to the first direction, has a second polarizing unit arranged on a light incident side, and converts the light condensed by the lens system into an electric signal, the first polarizing unit having a first region and a second region that are arranged along the first direction, a polarization state of first region passing light that has passed through the first region being different from a polarization state of second region passing light that has passed through the second region, the second polarizing unit having a plurality of third regions and a plurality of fourth regions that are arranged alternately along the first direction and extend in the second direction, a polarization state of third region passing light that has passed through the third region being different from a polarization state of fourth region passing light that has passed through the fourth region, and the first region passing light passing through the third region and arriving at the imaging element and the second region passing light passing through the fourth region and arriving at the imaging element, thereby imaging an image to obtain a stereoscopic image in which a distance between a center of gravity point of the first region and a center of gravity point of the second region is set as a base-line length of binocular parallax, the imaging method including:

generating an electric signal to obtain a right eye image in the imaging element, by the first region passing light that has passed through the third region and has arrived at the imaging element;

generating an electric signal to obtain a left eye image in the imaging element, by the second region passing light that has passed through the fourth region and has arrived at the imaging element; and outputting the generated electric signals.

(24) The imaging method according to (23), wherein one third region and one fourth region are arranged with respect to N pixels (N represents $2^n$ and n represents a natural number of 1 to 5) along the first direction.

(25) The imaging method according to (24), wherein image data to obtain the right eye image and image data to obtain the left eye image are obtained on the basis of a depth map generated from the electric signal obtained by the first region passing light that has passed through the third region and the electric signal obtained by the second region passing light that has passed through the fourth region and electric signals from all of the imaging elements forming the imaging element array.

(26) <<Imaging Apparatus: Second Mode>>

An imaging apparatus including:

a first polarizing unit that polarizes light from an object;

a lens system that condenses light from the first polarizing unit; and an imaging element array that has imaging elements arranged in a matrix of a first direction and a second direction orthogonal to the first direction, has a second polarizing unit arranged on a light incident side, and converts the light condensed by the lens system into an electric signal, wherein the first polarizing unit has a first region and a second region that are arranged along the first direction, a polarization state of first region passing light that has passed through the first region is different from a polarization state of second region passing light that has passed through the second region, the second polarizing unit has a plurality of third regions and a plurality of fourth regions that are arranged alternately along the first direction and extend in the second direction, third region passing light that has passed through the third region is in a polarization state and fourth region passing light that has passed through the fourth region is in a non-polarization state, and the first region passing light passes through the third region and arrives at the imaging element and the first region passing light and the second region passing light pass through the fourth region and arrive at the imaging element, thereby imaging an image to obtain a stereoscopic image in which a distance between a center of gravity point of the first region and a center of gravity point of the first polarizing unit is set as a base-line length of binocular parallax.

(27) <<Imaging Method: Second Mode>>

An imaging method using an imaging apparatus, the imaging apparatus including a first polarizing unit that polarizes light from an object, a lens system that condenses light from the first polarizing unit, and an imaging element array that has imaging elements arranged in a matrix of a first direction and a second direction orthogonal to the first direction, has a second polarizing unit arranged on a light incident side, and converts the light condensed by the lens system into an electric signal, the first polarizing unit having a first region and a second region that are arranged along the first direction, a polarization state of first region passing light that has passed through the first region being different from a polarization state of second region passing light that has passed through the second region, the second polarizing unit having a plurality of third regions and a plurality of fourth regions that are arranged alternately along the first direction and extend in the second direction, third region passing light that has passed through the third region being in a polarization state and fourth region passing light that has passed through the fourth region being in a non-polarization state, and the first region passing light passing through the third region and arriving at the imaging element and the first region passing light and the second region passing light passing through the fourth region and arriving at the imaging element, thereby imaging an image to obtain a stereoscopic image in which a distance between a center of gravity point of the first region and a center of gravity point of the first polarizing unit is set as a base-line length of binocular parallax, the imaging method including:

generating an electric signal to obtain one of a right eye image and a left eye image in the imaging element, by the first region passing light that has passed through the third region and has arrived at the imaging element;

generating an electric signal to obtain the other of the right eye image and the left eye image in the imaging element, by the first region passing light and the second region passing light that have passed through the fourth region and have arrived at the imaging element; and outputting the generated electric signals.

Additionally, the imaging apparatus according to the second mode of the present disclosure described in (26) and the imaging method according to the second mode of the present disclosure described in (27) may also be expressed as follows.

(26') <<Imaging Apparatus: Second Mode>>

An imaging apparatus including:

a first polarizing unit that polarizes light from an object;

a lens system that condenses light from the first polarizing unit; and an imaging element array that has imaging elements arranged in a matrix of a first direction and a second direction orthogonal to the first direction, has a second polarizing unit arranged on a light incident side, and converts the light condensed by the lens system into an electric signal, wherein the first polarizing unit has a first region and a second region that are arranged along the first direction, a polarization state of first region passing light that has passed through the first region is different from a polarization state of second region passing light that has passed through the second region, the second polarizing unit has a plurality of third regions that are arranged separately along the first direction and extend in the second direction, third region passing light that has passed through the third region is in a polarization state and light that has passed through a region other than the third region in the second polarizing unit is in a non-polarization state, and the first region passing light passes through the third region and arrives at the imaging element and the first region passing light and the second region passing light pass through a region other than the third region in the second polarizing unit and arrive at the imaging element, thereby imaging an image to obtain a stereoscopic image in which a distance between a center of gravity point of the first region and a center of gravity point of the first polarizing unit is set as a base-line length of binocular parallax.

(27')<<Imaging Method: Second Mode>>

An imaging method using an imaging apparatus, the imaging apparatus including a first polarizing unit that polarizes light from an object, a lens system that condenses light from the first polarizing unit, and an imaging element array that has imaging elements arranged in a matrix of a first direction and a second direction orthogonal to the first direction, has a second polarizing unit arranged on a light incident side, and converts the light condensed by the lens system into an electric signal, the first polarizing unit having a first region and a second region that are arranged along the first direction, a polarization state of first region passing light that has passed through the first region being different from a polarization state of second region passing light that has passed through the second region, the second polarizing unit having a plurality of third regions that are arranged separately along the first direction and extend in the second direction, third region passing light that has passed through the third region being in a polarization state and light that has passed through a region other than the third region in the second polarizing unit being in a non-polarization state, and the first region passing light passing through the third region and arriving at the imaging element and the first region passing light and the second region passing light passing through a region other than the third region in the second polarizing unit and arriving at the imaging element, thereby imaging an image to obtain a stereoscopic image in which a distance between a center of gravity point of the first region and a center of gravity point of the first polarizing unit is set as a base-line length of binocular parallax, the imaging method including:

generating an electric signal to obtain one of a right eye image and a left eye image in the imaging element, by the first region passing light that has passed through the third region and has arrived at the imaging element;

generating an electric signal to obtain the other of the right eye image and the left eye image in the imaging element, by the first region passing light and the second region passing light that have passed through the region other than the third region in the second polarizing unit and have arrived at the imaging element; and outputting the generated electric signals.

The present disclosure contains subject matter related to that disclosed in Japanese Priority Patent Application JP 2011-215895 filed in the Japan Patent Office on Sep. 30, 2011, the entire content of which is hereby incorporated by reference.

What is claimed is:

1. An imaging apparatus comprising:
   a first polarizing unit;
   an imaging element array that has imaging elements arranged in a matrix of a first direction and a second direction orthogonal to the first direction, has a second polarizing unit arranged on a light incident side of the imaging element array, has a plurality of microlenses respectively associated with the imaging elements, and converts light into an electric signal; and
   a lens system with a first lens that condenses light and directs parallel light onto the first polarizing unit, and a second lens that focuses light from the first polarizing unit onto the second polarizing unit,
   wherein,
      the first polarizing unit with a polarizing plate that is divided into a first region and a second region that are arranged adjacent to each other along the first direction,
      light from the first lens is incident on both the first region and the second region of the first polarizing unit,
      a polarization state of first region passing light that has passed through the first region is different from a polarization state of second region passing light that has passed through the second region,
      the second polarizing unit has a plurality of third regions and a plurality of fourth regions that are arranged adjacently and alternately along the first direction and extend in the second direction,
      light from the second lens is incident on all of the third regions and the fourth regions,
      a polarization state of third region passing light that has passed through the third regions is different from a polarization state of fourth region passing light that has passed through the fourth regions, and
      the first region passing light that passes through the third regions and arrives at the imaging element and the second region passing light that passes through the fourth regions and arrives at the imaging element form a stereoscopic image in which a distance between a center of gravity point of the first region and a center of gravity point of the second region is a base-line length of binocular parallax.

2. The imaging apparatus according to claim 1, wherein the first polarizing unit is arranged in a vicinity of a diaphragm unit of the lens system.

3. The imaging apparatus according to claim 1, wherein:
   a central region is between the first region and the second region in the first polarizing unit, and
   a polarization state of a central region passing light that has passed through the central region does not change from a polarization state of light before being incident on the central region.

4. The imaging apparatus according to claim 1, wherein a direction of an electric field of the first region passing light is orthogonal to a direction of an electric field of the second region passing light.

5. The imaging apparatus according to claim 4, wherein the direction of the electric field of the first region passing light is parallel to the first direction.

6. The imaging apparatus according to claim 4, wherein the direction of the electric field of the first region passing light forms an angle of 45 degrees with the first direction.

7. The imaging apparatus according to claim 4, wherein the direction of the electric field of the first region passing light is parallel to a direction of an electric field of the third region passing light, and the direction of the electric field of the second region passing light is parallel to a direction of an electric field of the fourth region passing light.

8. The imaging apparatus according to claim 4, wherein the polarizing plate has an extinction ratio of 3 or more.

9. The imaging apparatus according to claim 4, wherein:
   each imaging element includes a stack comprising a color filter, an on-chip lens, and a wire grid polarizer, and the wire grid polarizer forms the third region or the fourth region.

10. The imaging apparatus according to claim 4, wherein:
the imaging element includes a stack comprising a wire grid polarizer, a color filter, and an on-chip lens, and
the wire grid polarizer forms the third region or the fourth region.

11. The imaging apparatus according to claim 9, wherein an extension direction of a plurality of wires forming the wire grid polarizer is parallel to the first direction or the second direction.

12. The imaging apparatus according to claim 1, wherein a quarter-wave plate is arranged on a light incident side of the first polarizing unit.

13. The imaging apparatus according to claim 5, wherein a quarter-wave plate is arranged on a light incident side of the first polarizing unit, and a fast axis of the quarter-wave plate forms a predetermined angle with the direction of the electric field of the first region passing light.

14. The imaging apparatus according to claim 13, wherein the quarter-wave plate includes a first quarter-wave plate and a second quarter-wave plate that are arranged along the first direction or the second direction, a fast axis of the first quarter-wave plate forms a predetermined angle with the direction of the electric field of the first region passing light, and a fast axis of the second quarter-wave plate is orthogonal to the fast axis of the first quarter-wave plate.

15. The imaging apparatus according to claim 13, wherein the predetermined angle is 45 degrees.

16. The imaging apparatus according to claim 13, wherein:
the direction of the electric field of the first region passing light is parallel to a direction of an electric field of the third region passing light, and
the direction of the electric field of the second region passing light is parallel to a direction of an electric field of the fourth region passing light.

17. The imaging apparatus according to claim 13, wherein:
the first polarizing unit is mounted to the lens system to be removable, and
the quarter-wave plate is mounted to the lens system to be removable.

18. The imaging apparatus according to claim 13, wherein the quarter-wave plate is arranged to be adjacent to the first polarizing unit.

19. The imaging apparatus according to claim 1, wherein:
a polarizing plate that has a polarization axis of α degrees is arranged on a light incident side of the first polarizing unit,
the first region is configured using a first wave plate and the second region is configured using a second wave plate, and
a direction of an electric field of the first region passing light is orthogonal to a direction of an electric field of the second region passing light.

20. The imaging apparatus according to claim 19, wherein a value of α is 45 degrees, the first wave plate is composed of a half-wave plate, and the second wave plate is composed of a half-wave plate that is different from the half-wave plate forming the first wave plate in a phase difference.

21. The imaging apparatus according to claim 1, wherein the imaging element array has a Bayer arrangement in which each pixel includes four imaging elements, and one third region or one fourth region overlies the four imaging elements of the pixel.

22. The imaging apparatus according to claim 1, wherein one third region and one fourth region are arranged with respect to N pixels (N represents $2^n$ and n represents a natural number of 1 to 5) along the first direction.

23. An imaging method using an imaging apparatus, the imaging apparatus including a first polarizing unit, an imaging element array that (a) has imaging elements arranged in a matrix of a first direction and a second direction orthogonal to the first direction, (b) has a second polarizing unit arranged on a light incident side of the imaging element array, (c), has a plurality of microlenses respectively associated with the imaging elements, and (d) converts light into an electric signal, and a lens system with a first lens that condenses light and directs parallel light onto the first polarizing unit, and a second lens that focuses light from the first polarizing unit onto the second polarizing unit, the first polarizing unit having a polarizing plate that is divided into a first region and a second region that are arranged adjacent to each other along the first direction, light from the first lens being incident on both the first region and the second region of the first polarizing unit, a polarization state of a first region passing light that has passed through the first region being different from a polarization state of a second region passing light that has passed through the second region, the second polarizing unit having a plurality of third regions and a plurality of fourth regions that are arranged adjacently and alternately along the first direction and extend in the second direction, light from the second lens being incident on all of the third regions and the fourth regions, a polarization state of third region passing light that has passed through the third regions being different from a polarization state of fourth region passing light that has passed through the fourth regions, and the first region passing light that passes through the third regions and arrives at the imaging element and the second region passing light that passes through the fourth regions and arrives at the imaging element form a stereoscopic image in which a distance between a center of gravity point of the first region and a center of gravity point of the second region is a base-line length of binocular parallax, the imaging method comprising:
generating an electric signal to obtain a right eye image in the imaging element by the first region passing light that has passed through the third region and has arrived at the imaging element;
generating an electric signal to obtain a left eye image in the imaging element by the second region passing light that has passed through the fourth region and has arrived at the imaging element; and
outputting the generated electric signals.

24. The imaging method according to claim 23, wherein one third region and one fourth region are arranged with respect to N pixels (N represents $2^n$ and n represents a natural number of 1 to 5) along the first direction.

25. The imaging method according to claim 24, wherein image data to obtain the right eye image and image data to obtain the left eye image are obtained on the basis of a depth map generated from the electric signal obtained by the first region passing light that has passed through the third region and the electric signal obtained by the second region passing light that has passed through the fourth region and electric signals from all of the imaging elements forming the imaging element array.

26. An imaging apparatus comprising:
a first polarizing unit;
an imaging element array that has imaging elements arranged in a matrix of a first direction and a second direction orthogonal to the first direction, has a second polarizing unit arranged on a light incident side, and converts light into an electric signal; and a lens system with a first lens that condenses light from an object and directs the condensed light onto the first polarizing unit, and a second lens that images light from the first polarizing unit onto the second polarizing unit, wherein, the first polarizing unit has a first region and a second region that are arranged adjacent to each other along the first direction, light from the first lens is incident on the first region and the second region, a polarization state of first region passing light that has passed through the first region is different from a polarization state of second region passing light that has passed through the second region, the second polarizing unit has a plurality of third regions and a plurality of fourth regions that are arranged adjacently and alternately along the first direction and extend in the second direction, light from the second lens is incident on the third and fourth regions, third region passing light that has passed through the third region is in a polarization state and fourth region passing light that has passed through the fourth region is in a non-polarization state, and the first region passing light passes through the third region and arrives at the imaging element and the first region passing light and the second region passing light pass through the fourth region and arrive at the imaging element, thereby imaging an image to obtain a stereoscopic image in which a distance between a center of gravity point of the first region and a center of gravity point of the first polarizing unit is set as a base-line length of binocular parallax.

27. An imaging method using an imaging apparatus, the imaging apparatus including a first polarizing unit, an imaging element array that has imaging elements arranged in a matrix of a first direction and a second direction orthogonal to the first direction, has a second polarizing unit arranged on a light incident side, and converts light into an electric signal, and a lens system with a first lens that condenses light from an object and directs the condensed light onto the first polarizing unit, and a second lens that images light from the first polarizing unit onto the second polarizing unit, the first polarizing unit having a first region and a second region that are arranged adjacent to each other along the first direction, light from the first lens being incident on the first region and the second region, a polarization state of first region passing light that has passed through the first region being different from a polarization state of second region passing light that has passed through the second region, the second polarizing unit having a plurality of third regions and a plurality of fourth regions that are arranged adjacently and alternately along the first direction and extend in the second direction, light from the second lens is incident on the third and fourth regions, third region passing light that has passed through the third region being in a polarization state and fourth region passing light that has passed through the fourth region being in a non-polarization state, and the first region passing light passing through the third region and arriving at the imaging element and the first region passing light and the second region passing light passing through the fourth region and arriving at the imaging element, thereby imaging an image to obtain a stereoscopic image in which a distance between a center of gravity point of the first region and a center of gravity point of the first polarizing unit is set as a base-line length of binocular parallax, the imaging method comprising:

generating an electric signal to obtain one of a right eye image and a left eye image in the imaging element, by the first region passing light that has passed through the third region and has arrived at the imaging element;

generating an electric signal to obtain the other of the right eye image and the left eye image in the imaging element, by the first region passing light and the second region passing light that have passed through the fourth region and have arrived at the imaging element; and outputting the generated electric signals.

* * * * *